(12) United States Patent
Sul et al.

(10) Patent No.: US 8,598,898 B2
(45) Date of Patent: Dec. 3, 2013

(54) TESTING OF HIGH-SPEED INPUT-OUTPUT DEVICES

(75) Inventors: Chinsong Sul, Mountain View, CA (US); Min-Kyu Kim, Sunnyvale, CA (US); Son Nguyen, San Jose, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 503 days.

(21) Appl. No.: 12/898,528

(22) Filed: Oct. 5, 2010

(65) Prior Publication Data
US 2012/0081138 A1 Apr. 5, 2012

(51) Int. Cl.
*G01R 31/3187* (2006.01)

(52) U.S. Cl.
USPC ........ 324/750.3; 324/555; 375/224; 370/241; 370/249

(58) Field of Classification Search
USPC ......... 324/750.3, 555; 375/224; 370/241, 249
See application file for complete search history.

(56) References Cited

U.S. PATENT DOCUMENTS

| | | | |
|---|---|---|---|
| 4,271,433 A * | 6/1981 | Theriault | 348/731 |
| 7,200,170 B1 * | 4/2007 | Desandoli et al. | 375/224 |
| 7,388,424 B2 | 6/2008 | Miller | |
| 7,560,949 B2 | 7/2009 | Noda | |
| 8,386,867 B2 | 2/2013 | Sul et al. | |
| 2004/0123197 A1 | 6/2004 | Sunter et al. | |
| 2004/0128121 A1 * | 7/2004 | Truebenbach et al. | 703/27 |
| 2006/0103407 A1 * | 5/2006 | Kakizawa et al. | 324/763 |
| 2006/0123304 A1 | 6/2006 | Panis et al. | |
| 2006/0159200 A1 * | 7/2006 | Hsu et al. | 375/316 |
| 2006/0253752 A1 * | 11/2006 | Krishnan et al. | 714/724 |
| 2009/0206867 A1 * | 8/2009 | Stott et al. | 324/763 |
| 2011/0004793 A1 | 1/2011 | Sul et al. | |
| 2011/0167308 A1 | 7/2011 | Sul | |

OTHER PUBLICATIONS

International Search Report and Written Opinion in International Patent Application No. PCT/US2011/054990 mailed Apr. 24, 2012, 9 pages.

* cited by examiner

*Primary Examiner* — Patrick Assouad
*Assistant Examiner* — Alexander J Nemtzow
(74) *Attorney, Agent, or Firm* — Blakely Sokoloff Taylor Zafman LLP

(57) ABSTRACT

Embodiments of the invention are generally directed to testing of high-speed input-output devices. An embodiment of a high-speed input-output apparatus includes a transmitter and a receiver, and a loop-back connection from an output of the transmitter to an input of the receiver, the loop-back connection including a first connector and a second connector for transmission of differential signals. The apparatus further includes a first inductor having a first terminal and a second terminal and second inductor having a first terminal and a second terminal, the first terminal of the first inductor being connected to the first connector and the first terminal of the second inductor being connected to the second connector, the second terminal of the first inductor and the second terminal of the second inductor providing a test access port for direct current testing of the apparatus.

29 Claims, 23 Drawing Sheets

1900

N = 8

| Test Access | TC[2] | TC[1] | TC[0] |
|---|---|---|---|
| V[k,0] | 0 | 0 | 0 |
| V[k,1] | 0 | 0 | 1 |
| V[k+1,0] | 0 | 1 | 0 |
| V[k+1,1] | 0 | 1 | 1 |
| V[k+2,0] | 1 | 0 | 0 |
| V[k+2,1] | 1 | 0 | 1 |
| V[k+3,0] | 1 | 1 | 0 |
| V[k+1,1] | 1 | 1 | 1 |

N = 4

US 8,598,898 B2

TESTING OF HIGH-SPEED INPUT-OUTPUT DEVICES

TECHNICAL FIELD

Embodiments of the invention generally relate to the field of electronic devices and, more particularly, testing of high-speed input-output devices.

BACKGROUND

The price of commercial integrated circuits (ICs) is continuously under competitive pressure. Although costs of manufacturing may be reduced in many ways, the cost of testing ICs remains difficult, with cost levels persisting if not increasing. Many IC defects are difficult to detect accurately and reliably, and the testing for such defects may become more increasingly complex as the ICs continue to become smaller and run at higher speeds.

Among ICs that require complex are high-speed input-output (HSIO) devices. Test cost for HSIO devices may be even higher compared to conventional digital counterparts because it can be more difficult to get HSIO testing to work properly and because such testing often utilizes additional specialized high-end ATE (automatic test equipment). In particular, defects in differential bonding wires of HSIO devices may be difficult to detect.

In the testing of HSIO devices, an HSIO loop-back test may offer a useful testing alternative to lower the cost of HSIO test. A conventional HSIO loop-back test, in which one or more transmitter outputs are looped back to transmit test signals to one or more receiver inputs, may allow testing without requiring a dedicated high performance ATE for the HSIO test.

HSIO devices often employ differential signaling through two-bit wires and inherently are fault-tolerant. For this reason, a loop-back test may pass defective HSIO devices that may then fail in field applications. To preserve a low cost benefit of the loop-back test, this test quality gap may be filled with complementary test methods that may require test access to the loop-back test environment.

However, providing test access by connecting test equipment to the differential lines of the high-speed lines for the device commonly interferes with the operation of the devices under test, thereby complicating the testing process.

BRIEF DESCRIPTION OF THE DRAWINGS

Embodiments of the invention are illustrated by way of example, and not by way of limitation, in the figures of the accompanying drawings in which like reference numerals refer to similar elements.

SUMMARY

Figure 1:
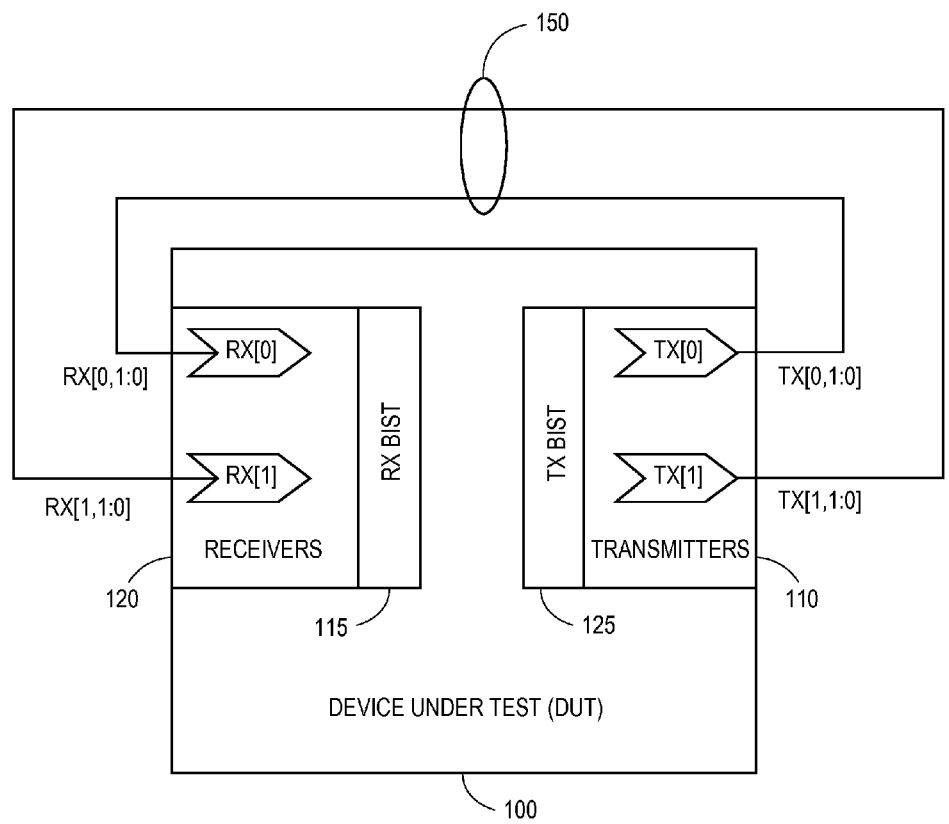
FIG. 1 is an illustration of a loop-back test of a device.

Embodiments of the invention are generally directed to testing of high-speed input-output devices.

In a first aspect of the invention, an embodiment of a high-speed input-output apparatus includes a transmitter and a receiver, and a loop-back connection from an output of the transmitter to an input of the receiver, the loop-back connection including a first connector and a second connector for transmission of differential signals. The apparatus further includes a first inductor having a first terminal and a second terminal and second inductor having a first terminal and a second terminal. The first terminal of the first inductor is connected to the first connector and the first terminal of the second inductor is connected to the second connector, where the second terminal of the first inductor and the second terminal of the second inductor providing a test access port for direct current testing of the apparatus.

In a second aspect of the invention, a method for testing high-speed input-output devices includes enabling a loop-back connection between an output of transmitter of a high-speed input-output device to an input of a receiver of the device, the loop-back connection including a first connector and a second connector, and performing an active high-speed test of the device using the loop-back connection, the high-speed test including the transmission of differential signals via the first connector and the second connector. The method further includes performing direct current tests of the device, where performing the direct current tests includes receiving test data via a test access port for the loop-back connection. A first inductor having a first terminal and a second terminal is connected by the first terminal to the first connector and a second inductor having a first terminal and a second terminal is connected by the first terminal to the second connector, the test port comprising the second terminal of the first inductor and the second terminal of the second inductor.

DETAILED DESCRIPTION

Embodiments of the invention are generally directed to testing of high-speed input-output devices.

In some embodiments, a method, apparatus, or system provides for testing of high-speed input-output devices. In some embodiments, testing includes a test access port to allow for parameter testing without interfering with loop-back testing. In some embodiments, testing may include fault detection for bonding wires of high-speed devices.

Differential signaling is commonly employed in HSIO devices and systems, and their inherent fault-tolerance may operate to pass a functional loop-back test in presence of faults, thereby preventing the detection of such faults. In some embodiments, a system is provided to detect faults in high-speed devices that may not be detected in a functional loop-back test.

In some embodiments, a method, apparatus, or system may provide a process for HSIO differential bonding wire testing in a loop-back test environment where the test access is limited. In some embodiments, because HSIO connections are sensitive to capacitive loading, a method, apparatus, or system utilizes a non-intrusive test access concept to provide testing high-speed devices without significantly affecting the performance of a loop-back functional test. In some embodiments, a test may be applied to test various standards of HSIO, such as HDMI (High-Definition Multimedia Interface), Serial ATA (Advanced Technology Attachment), PCI-express, and others, and may be utilized to improve testability of a conventional loop-back test that is widely employed for a low cost HSIO test.

In some embodiments, a testing method, apparatus, or method includes use of inductors to tap into loop-back connections. In some embodiments, the inductance networks assist in reducing impact on loop-back testing, while allowing for DC parametric testing.

FIG. 1 is an illustration of a loop-back test of a device. In this illustration, a device under test 100 is a high-speed input-output device including a transmitter (or TX) 110 and a receiver (or RX) 120, denoted as TX[k] and RX[k] for k=0 and 1 for the outputs and inputs, are assumed to be a two-bit differential port devices. The differential HSIO ports may be denoted as Port[k, 1] and Port[k, 0] for a non-inverting (positive) port and an inverting (negative), respectively. The positive and the negative ports may be written compactly as Port [k, 1:0]. Thus, in this illustration loop-back connectors 150 for test are made from TX[k, 1:0] to RX[k, 1:0] respectively, the loop-back connectors being wires, traces, or other connectors. Built-in test hardware may be denoted as TX BIST (Built-In Self-Test) and RX BIST. In this illustration, test patterns are generated by the TX BIST and transmitted via the transmitter. The transmitted test patterns then are recovered at the receiver and checked by the RX BIST to detect errors. In some embodiments, a method, apparatus, or system provides a test access port to the loop-back connectors, thereby allowing for effective parametric testing of the device under test 100.

Figure 2:
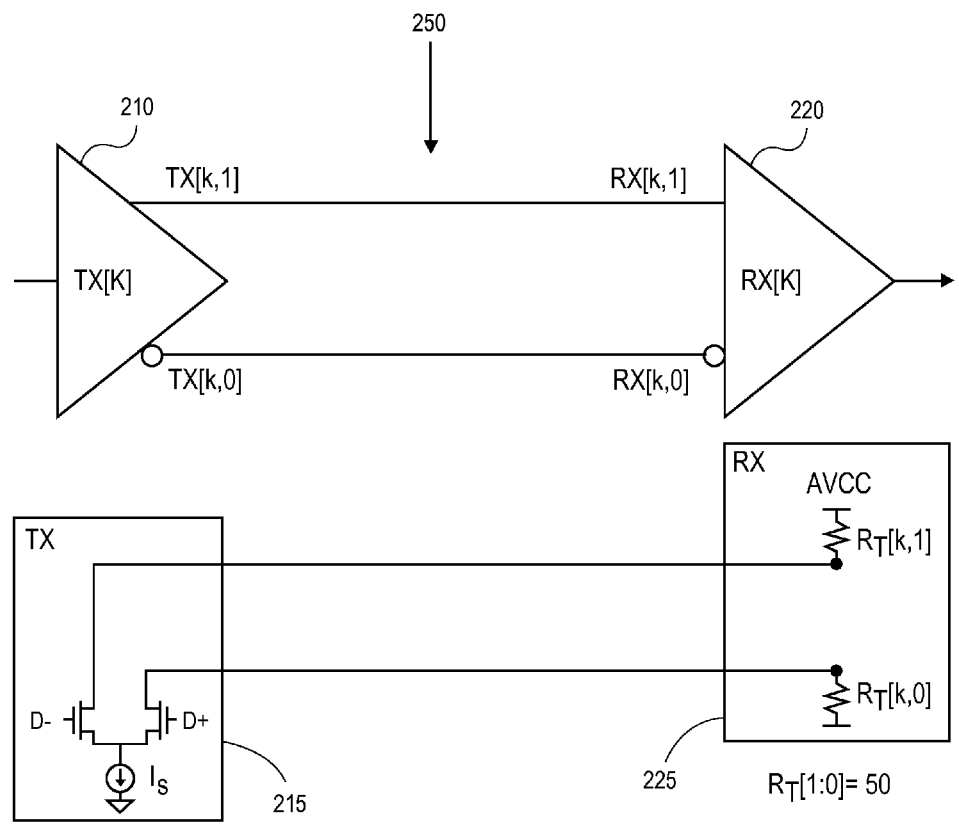
FIG. 2 illustrates an DC coupled HSIO apparatus.
Figure 3:
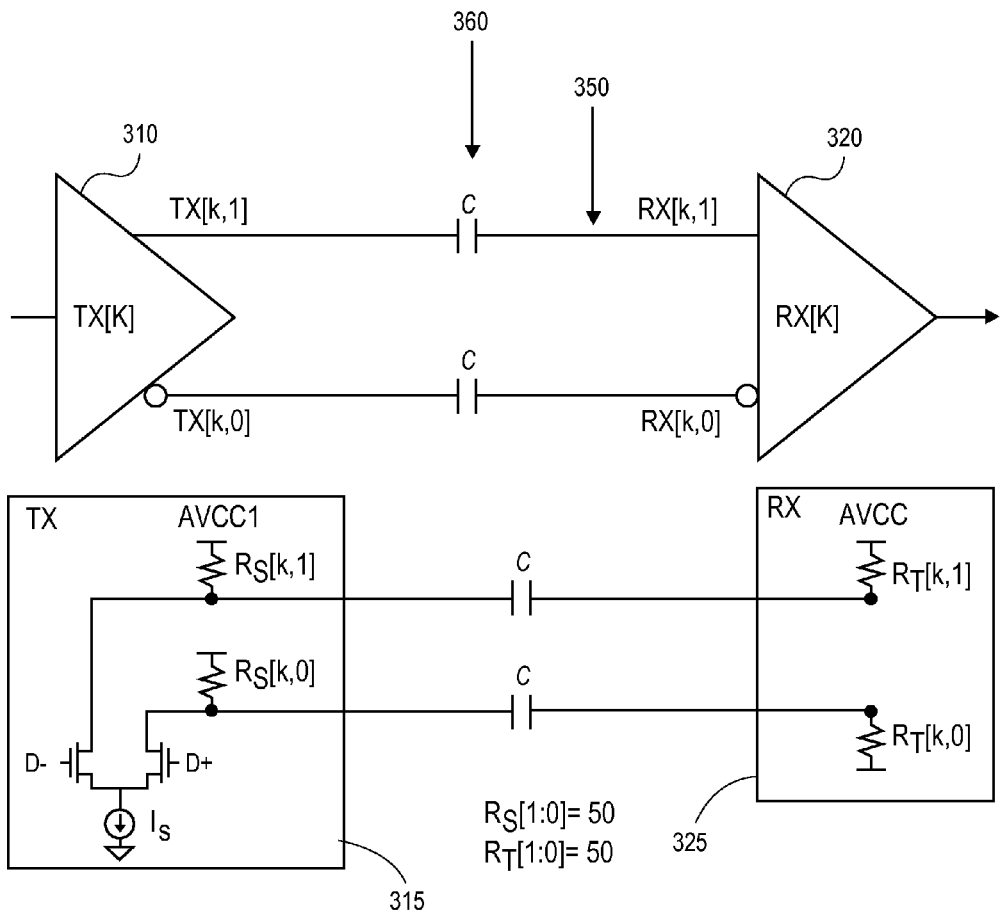
FIG. 3 illustrates an AC coupled HSIO apparatus.

Commonly adapted HSIO connection schemes include DC (direct current) coupled and AC (alternating current) coupled connections. FIG. 2 illustrates a DC-coupled HSIO apparatus, and FIG. 3 illustrates an AC-coupled HSIO apparatus. In the DC-coupled HSIO apparatus as shown in FIG. 2, the transmitter 210 and the receiver 220 are connected by the differential wire loop-back connectors 250 for testing. The transmitter 210 may be viewed as a current source with a pair of switches (D−, D+) 215 controlled by the data bit and its logical complement. The receiver 220 may be viewed as a voltage sensing unit via a termination resistor connected to a DC power AVCC (analog supply voltage) 225. A commonly used termination resistor ($R_T[k,j]$, j=0 or 1) is a 50Ω resistor. In this illustration, the function of the switches is to connect or disconnect the current source to a differential wire so that the voltage at the receiver may be controlled. The voltage level is sensed at the receiver and is interpreted as a data element that is being transmitted. To communicate the data correctly, accuracies of the current source at the transmitter and the termination resistance at the receiver are extremely important in design, verification, and testing.

The AC-coupled HSIO connection, as depicted in FIG. 3, contains a capacitor 360 between each transmitter 310-315 and receiver 320-325 connection. The function of the capacitor 360 is to block the DC signals and to allow the AC signals (or transitions) to be propagated. Because no DC signals cross the capacitor 360, the transmitter 315 is required to contain a separate source termination resistor connected to a DC power source AVCC1 in order to generate the voltage swing required for data transmission. The commonly used transmitter source termination resistor ($R_S[k,j]$, j=0 or 1) is also a 50Ω resistor. Because the capacitor 360 blocks the DC signals, the AVCC does not need to be the same voltage as the AVCC1.

In some embodiments, a test access port provides access for testing of parameters for either the DC-coupled HSIO apparatus illustrated in FIG. 2 or the AC-coupled apparatus illustrated in FIG. 3.

Figure 4:
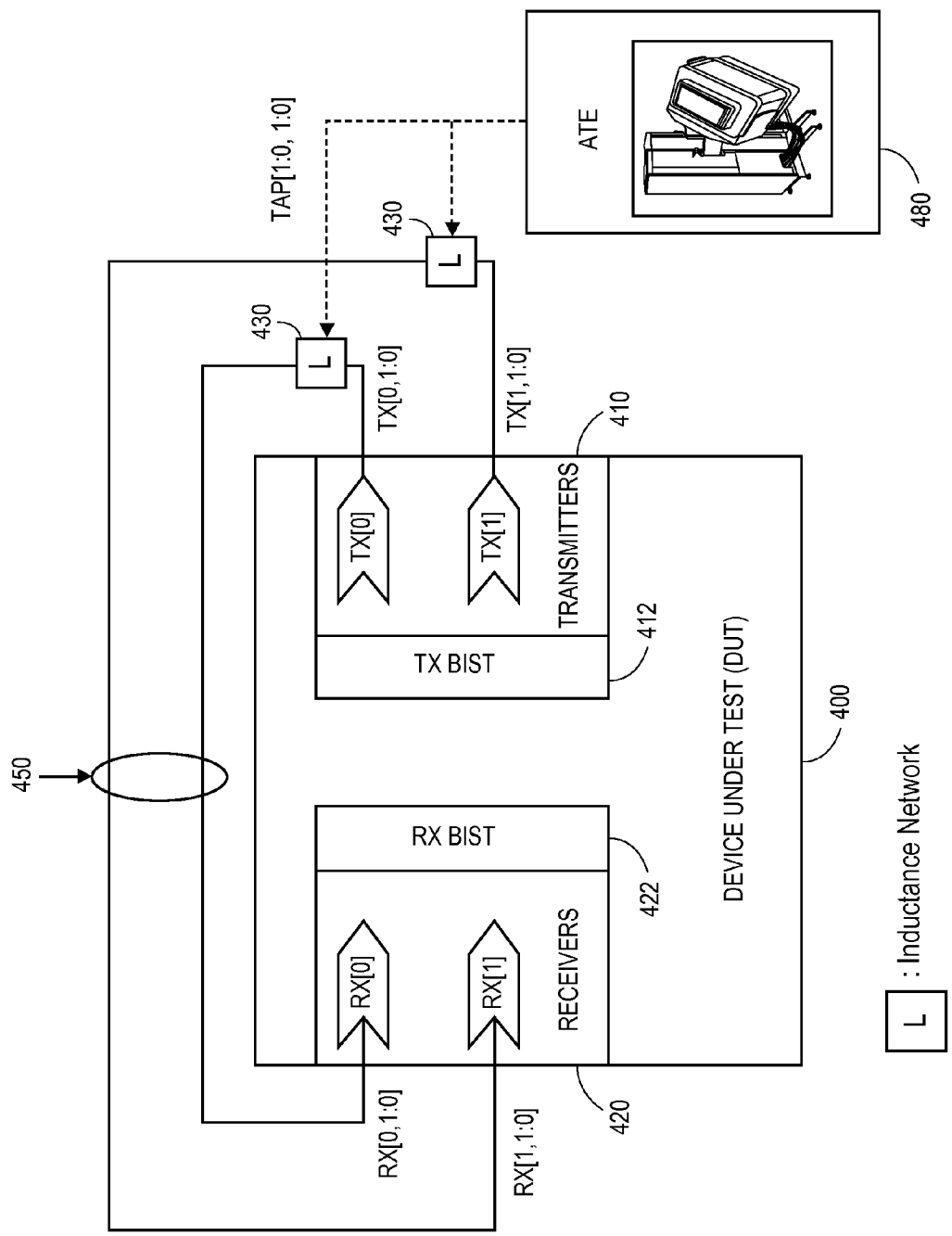
FIG. 4 an illustration of an embodiment of a test access port for a high-speed device.

FIG. 4 is an illustration of an embodiment of a test access port for a high-speed device. In this illustration, a device under test 400 includes transmitters 410 with TX BIST elements 412, the outputs of the transmitters 410 being connected via loop-back connectors 450 to receivers 420 with RX BIST elements 422. In some embodiments, a test access port (TAP) is created by connecting a tester channel to each loop-back connector in such a way that the capacitive load introduced by the tester channel and the wire trace from the ATE to the TAP does not significantly interfere with a loop-back test. In some embodiments, the TAP includes an inductor or inductor network 430 that allows for transmission of DC signals to testing equipment or test unit (also referred to as a tester) 480, and thus allows for measurement of DC parameters via the test access port.

Figure 5:
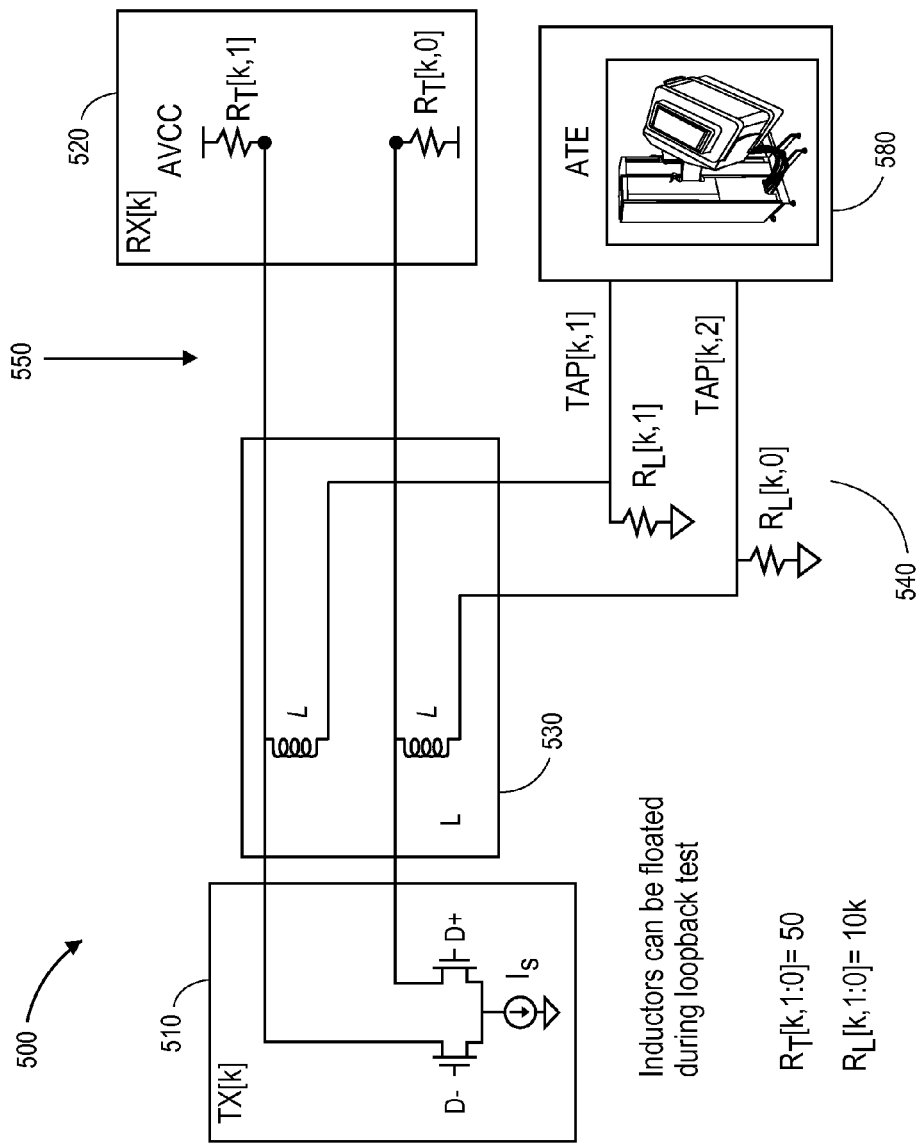
FIG. 5 illustrates an embodiment of a test access port created by using an inductor input to a DC-coupled HSIO apparatus.

In some embodiments, a tester channel is connected to the loop-back connector via the inductor or inductance network. The inductor may be used to isolate the capacitive load during a loop-back test that is running at high-speed (generally well above 100 MHz, for example) and then may act as a wire for the transmission of DC values when the transmitter is kept at quiescence. FIG. 5 illustrates an embodiment of a test access port created by using an inductor input to a DC-coupled HSIO apparatus. In this illustration, device 500 includes transmitter 510 connected to receiver 520 via loop-back differential wires, traces, or other connectors 550, with a test port connection to the differential wires 550 being generated through use of inductors, such as inductor network 530, to provide signals for testing by tester 580. In some embodiments, the inductors are placed near the differential wires 550 to minimize capacitance created by circuit board traces or other connection elements.

A minimum value of desired inductance may be determined by the inductor's impedance equation $Z=2\pi/L$, where Z, f, and L stand for impedance, frequency and inductance, respectively. If, for example, 1000Ω, or 1 KΩ, of impedance is sufficient to isolate the capacitive loading during the loop-back test running at 100 MHz, then the minimum required inductance may be determined by $L=Z/(2\pi f)=1000/(27\pi \times 10^8)=1.6\times 10^{-6}$H, or 1.6 µH. Thus, if the inductor with L=10

μH is used, for example, the loop-back test may be run without significant interference from the created test access port. If the transmitter is quiescent, i.e. f=0 Hz, then Z=0Ω and the inductor behaves as a wire as long as no AC-signals are injected from the test port. In some embodiments, the test access port provides a connection for DC parametric measurements.

In some embodiments, large resistances 540, denoted as $R_L[k, 1:0]$ and specified as, for example, 10 KΩ resistances in FIG. 5, may be incorporated into the interface of an inductance network 530 in order to further isolate capacitive loading of board traces that are made to create the test access from the ATE. The $R_L[k, 1:0]$ may be placed as close as practical to the inductors to further limit capacitance. The incorporation of the $R_L[k, 1:0]$ resistance may be utilized in any application, and thus, although the $R_L[k, 1:0]$ resistances are not illustrated explicitly in the following drawings, such resistances may be included in each embodiment of the test architecture.

In some embodiments, the wire behavior of inductors may also be utilized in digital tests such as structural tests to provide test mode signals that do not change during the test. Implementing the test mode signals through the embodiments of the test architecture may be utilized to allow more non-HSIO pins to be available for non-HSIO tests, and thus in some instances allow for overall test time to be reduced.

In some embodiments, using the test access scheme in FIG. 5, the DC design parameters, such as the transmitter driver current or current source $I_S$ and the receiver termination resistances ($R_T[k, 1:0]$), may be measured without significantly affecting validity and performance of a loop-back test. In some embodiments, detection of differential bonding wire defects may also be tested using the same test access by applying and measuring DC signals at the tester (or ATE).

Figure 6:
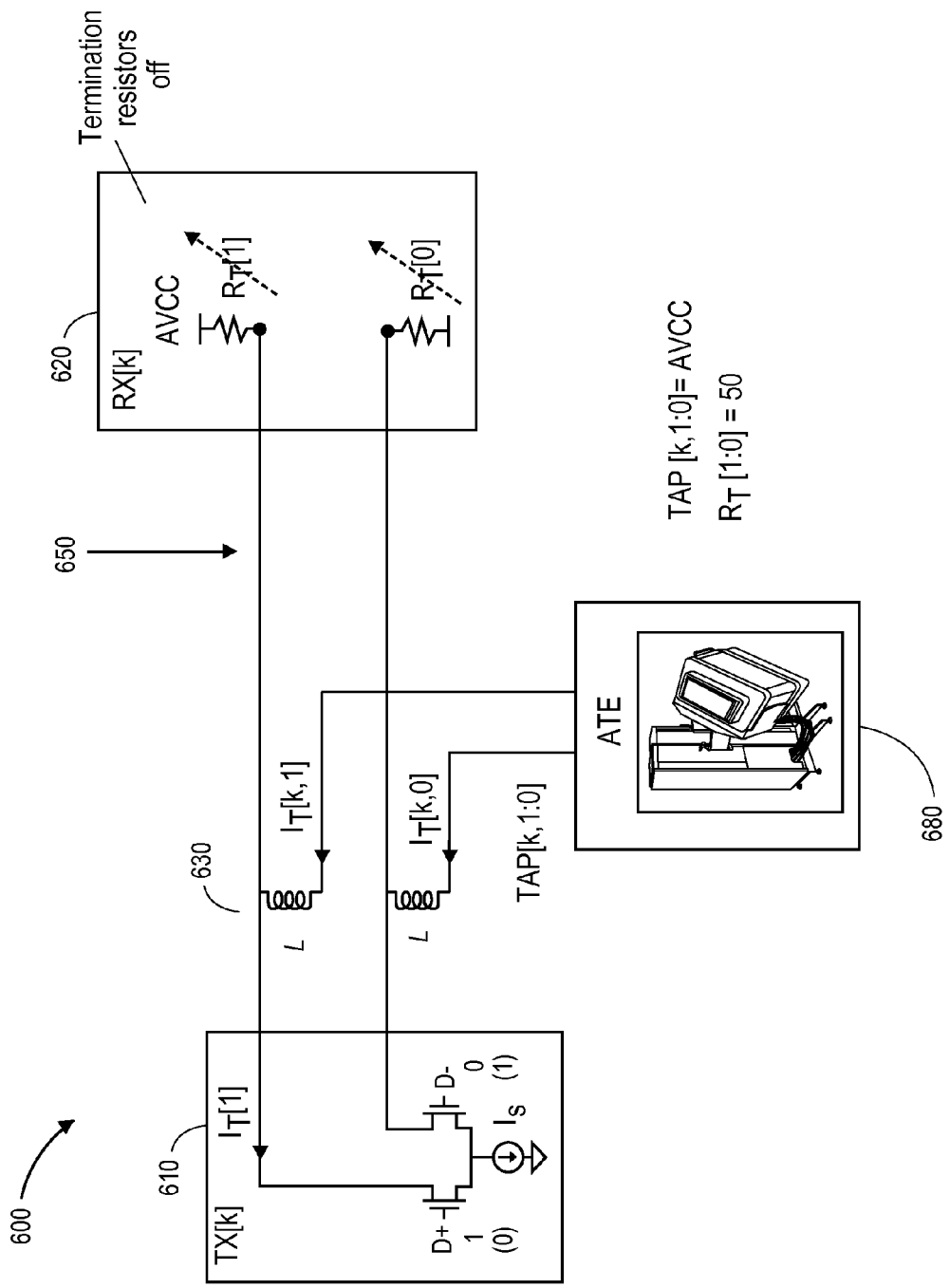
FIG. 6 is an illustration of an embodiment of testing including measurement of a current source.

Measurements of current source $I_S$ may be utilized to test the specification of transmitter driver current and the switch functions controlled by the data bits D+ and D−. FIG. 6 is an illustration of an embodiment of testing including measurement of a current source. In this illustration, device 600 includes transmitter 610 connected to receiver 620 via loop-back differential wires 650, with a test port connection to the differential wires 650 being generated through use of inductors, such as inductor network 630, to provide signals for testing by tester 680. For a transmitter driver current test, the receiver is disabled or the termination resistors are turned off, as provided in FIG. 6, so that no current is supplied from the receiver. The transmitter driver current test path may be established by the complementary data bits D+ and D− in the transmitter. If the transmitter is enabled, one of the switches, viewed in FIG. 6 as N-FET transistors, is turned on to connect the current source to one of two differential paths. FIG. 6 depicts the data bit D+=1 (and D−=0). This may, for example, be achieved by providing a test pattern composed only of logical '1' values to the transmitter. For the transmitter driver current test, the voltage of AVCC is applied to the TAP[k, 1:0] (which denotes TAP[k,0] and TAP[k,1]), and the current is measured through each TAP. In order to be free of faults, the measured current $I_T[k,1]$ at the ATE should be close to the specified value of $I_S$ if the source current is connected and 0 otherwise. In this determination, the equation x≈y is defined as $y-\lim_L \leq x \leq y+\lim_R$ for certain test limits of $\lim_L$ and $\lim_R$. In FIG. 6, for example, $I_T[k,1] \approx I_S$ and $I_T[k,0] \approx 0$. In some embodiments, the current measurements may further be used to detect faulty switches (the N-FET transistors in this illustration). If, for example, $I_T[k,j]$, where j=0 or 1, is out of the test limit, it may be concluded that the corresponding N-FET transistor is faulty (i.e. open, close or both operations are not fully functional). Complementary logic values may be provided to the data bits D+ and D− in order to measure $I_T[k, 1:0]$.

In some embodiments, a transmitter driver current test may be summarized as follows in Table 1:

TABLE 1

TX Driver Current Test (DC-coupled)

Figure 7:
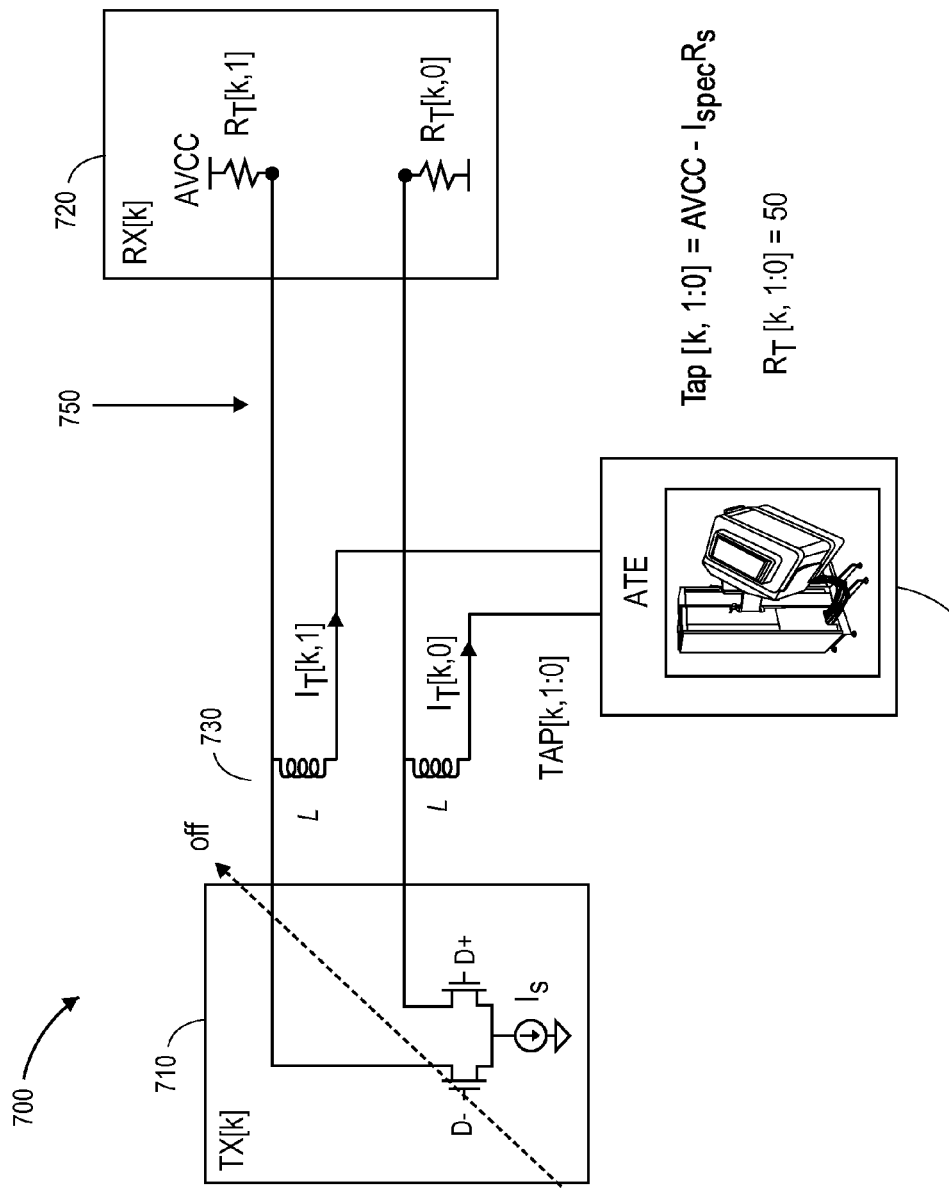
FIG. 7 is an illustration of an embodiment of testing including measurement of termination resistors.

1. Turn on TX and Turn off RX
2. TAP[k, 1:0] = AVCC
3. Set D+ = 0; D− = 1
4. D[1] = D+; D[0] = D−
5. Measure currents $I_T[k, 1:0]$ at TAP[k, 1:0]
6. For (0 ≤ j ≤ 1), Fail if not ($I_T[k,j] \approx I_S*D[j]$), where * denote multiplication
7. Set D+ = 1; D− = 0
8. Repeat steps 4, 5 and 6
9. End In some embodiments, measurement of the termination resistors $R_T[k, 1:0]$ may similarly be carried out using the same test access process. FIG. 7 is an illustration of an embodiment of testing including measurement of termination resistors. In this illustration, device 700 includes transmitter 710 connected to receiver 720 via loop-back differential wires 750, with a test port connection to the differential wires 750 being generated through use of inductors, such as inductor network 730, to provide signals for testing by tester 780. In some embodiments, for a termination resistance test, the transmitter 710 is turned off, as illustrated in FIG. 7, and no current is flowing to the transmitter. When the voltage of $AVCC-I_{Spec}R_T$ is applied to the test access ports, the termination resistance may be determined by measuring the currents $I_T[k, 1:0]$. In order to be free of faults, the measured current should be close to the current $I_T[k, 1:0] \approx I_{Spec}$. The value of current $I_{Spec}$ may be determined from the specification of termination resistance, i.e., the maximum current that can flow through the termination resistors. It is often the case that the $I_{Spec}=I_S$.

Alternatively, in some embodiments the termination resistance may be determined from the measured current through use of Ohm's law $R_T'[k, j]=(AVCC-V[k, j])/I_T[k, j]$, where j=0 or 1 and where $R_T'[k, j]$ denotes the determined termination resistance. Thus, the device under test passes the termination resistance test if the difference ($R_T[j]-R_T'[j]$) is within, for example, ±20% of $R_T[j]$.

In some embodiments, a receiver termination resistance test procedure may be summarized as follows in Table 2:

TABLE 2

RX Termination Resistance Test

Figure 8:
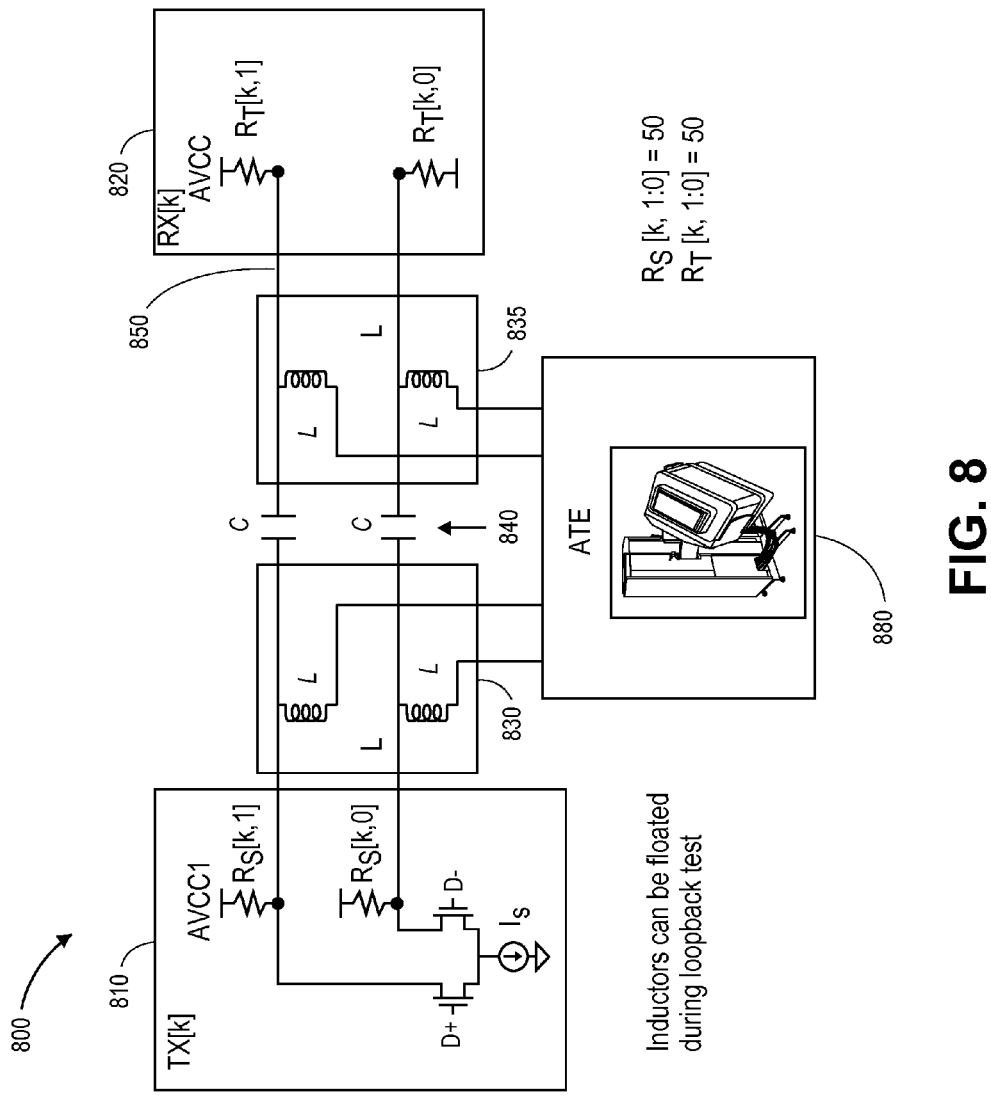
FIG. 8 and FIG. 9 depict embodiments of test access for the AC-coupled HSIO.
Figure 9:
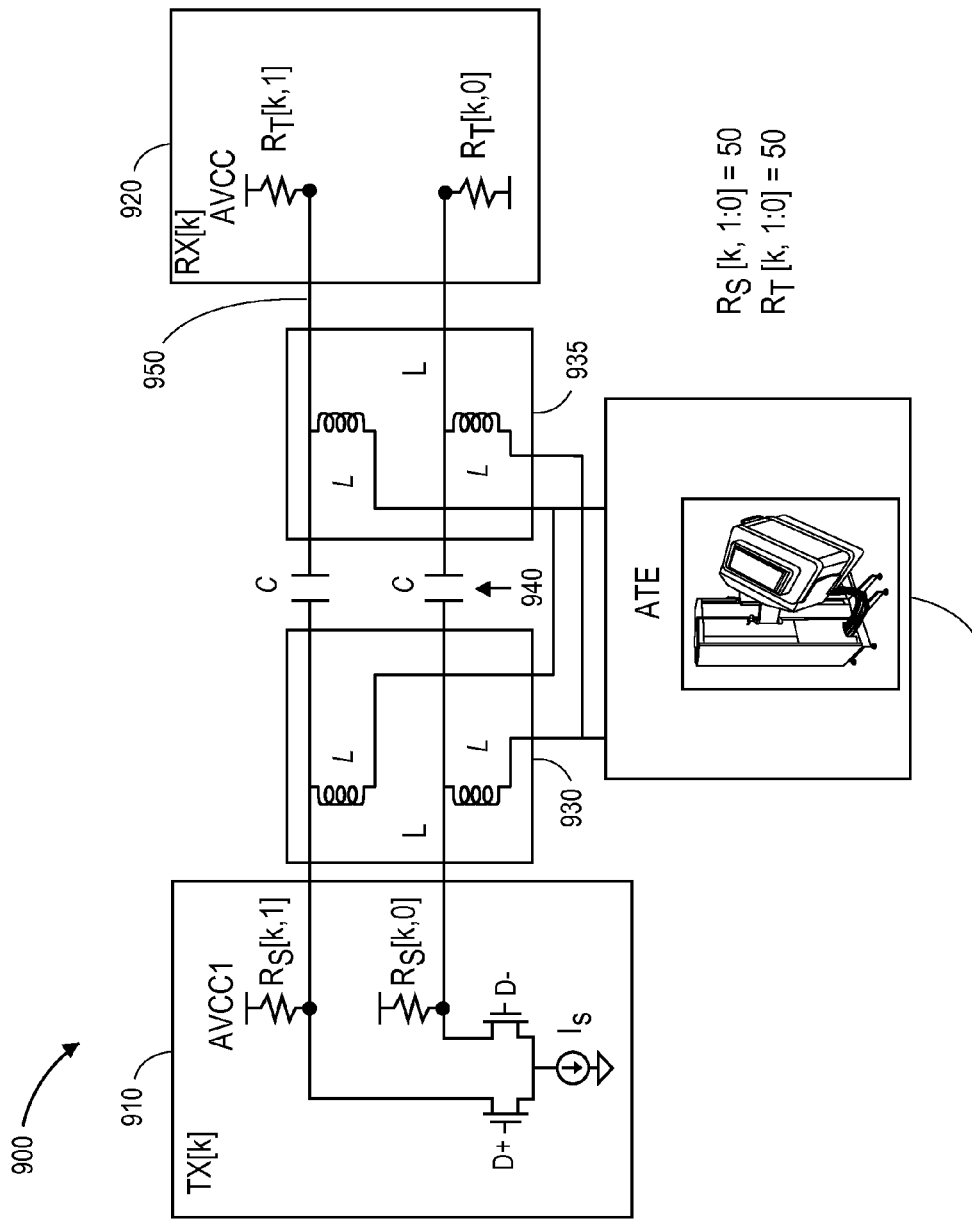

1. Turn off TX and turn on RX
2. TAP[k, 1:0] = AVCC − $I_{Spec}R_T[k,1:0]$
3. Measure voltages at $I_T[k,1:0]$ at TAP[k, 1:0] respectively
4. Fail if not ($I_T[k,1:0] \approx I_{Spec}$)
5. End In some embodiments, a test access scheme for the AC-coupled HSIO may similarly be implemented. FIG. 8 and FIG. 9 depict embodiments of test access for the AC-coupled HSIO. Because the capacitance between the transmitter and the transmitter in the loop-back connection blocks the DC signals flowing from the transmitter to the receiver and vice versa, the parallel test access as shown in FIG. 8 and the shared test access in FIG. 9 can be introduced. In FIG. 8, device 800 includes transmitter 810 connected to receiver 820 via loop-back differential wires 850, with AC coupling provided by capacitors 840, with a test port connection to the differential wires 850 being generated through use of inductors, such as first inductor network 830 on the transmitter side of the capacitors 840 and second inductor network 835 on the receiver side of the capacitors 840, to provide signals for testing by tester 880. In FIG. 9, device 900 includes transmitter 910 connected to receiver 920 via loop-back differential wires 950, with AC coupling provided by capacitors 940, with a test port connection to the differential wires 950 being generated through use of inductors, such as first inductor network 930 on the transmitter side of the capacitors 940 and second inductor network 935 on the receiver side of the capacitors 940, where the inductors on either side of the capacitors are connected, to provide signals for testing by tester 980.

Figure 10:
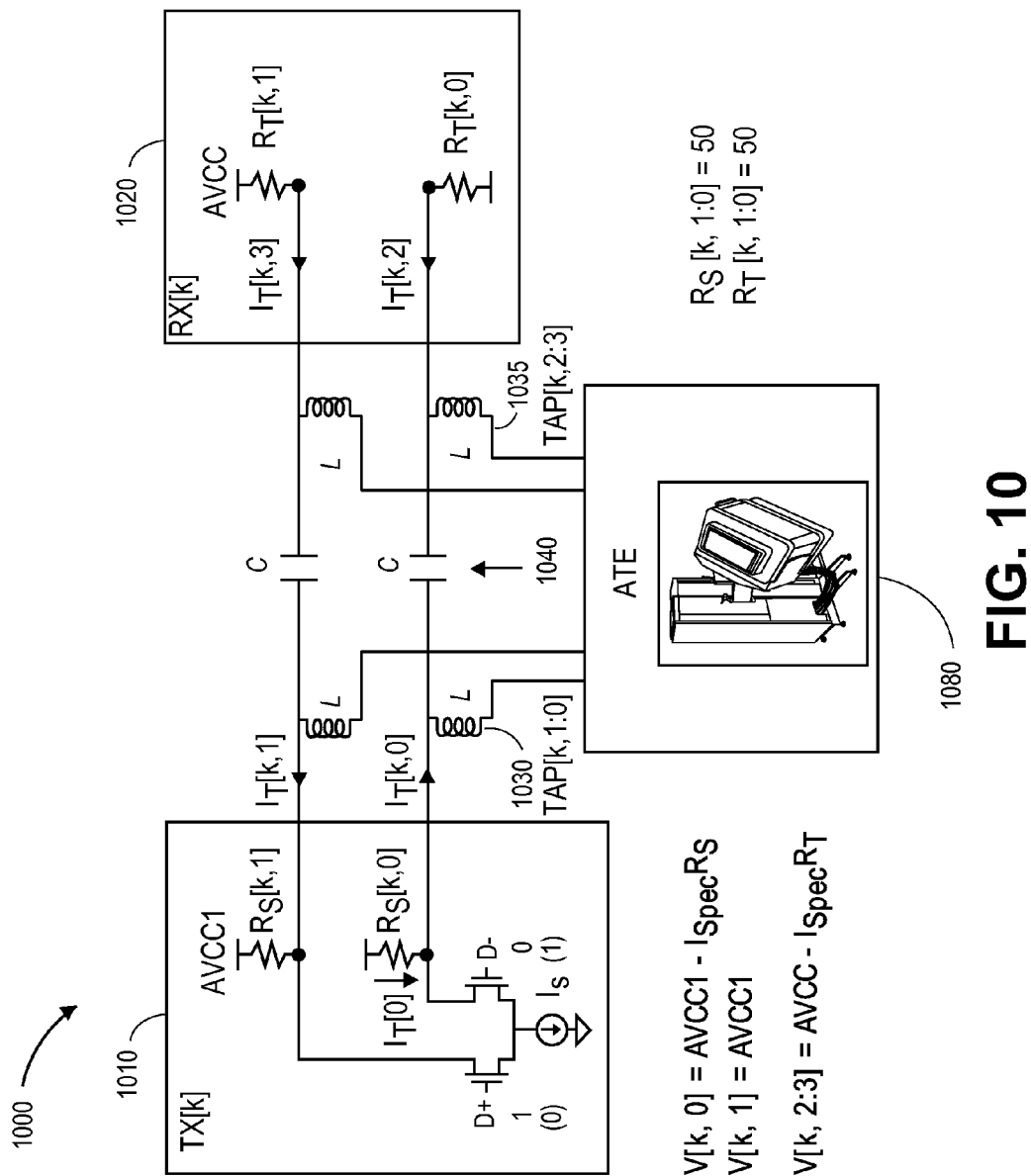
FIG. 10 is an illustration of an embodiment of concurrent DC parametric measurements.

In some embodiments, DC parametric measurements of transmitter and receiver may be carried out concurrently using a parallel test access. FIG. 10 is an illustration of an embodiment of concurrent DC parametric measurements. In FIG. 10, device 1000 includes transmitter 1010 connected to receiver 1020 via loop-back differential wires 1050, with AC coupling provided by capacitors 1040, with a test port connection to the differential wires 1050 being generated through use of inductors, such as first inductor network 1030 on the transmitter side of the capacitors 1040 and second inductor network 1035 on the receiver side of the capacitors 1040, to provide signals for testing by tester 1080. In some embodiments, the data bit is configured to enable the designated current path. In FIG. 10, the data bit D+=1 enables the current path and the transmitter driver current is measured at the TAP[k,1]. The voltage of TAP[k,1] is set to the AVCC1 to eliminate the current contribution from the voltage source through the source termination resistor $R_S[k,1]$. All other test access ports except TAP[k,1] are set to test the termination resistors that are connected to them. In the illustrated test, the appropriate voltages are forced on those ports to allow the specified maximum current can be to flow. For example, the voltages forced are V[k,0]=(AVCC1–$I_S R_S$) and V[k, 2:3]= (AVCC–$I_{Spec} R_T$). To pass the DC parametric test, the $I_T[k, 1:0] \approx I_S$, and $I_T[k, 2:3] \approx I_{Spec}$.

In some embodiments, a parallel test of transmitter driver current and receiver termination resistors may be summarized as follows:

TABLE 3

Parallel test of TX Driver Current & RX termination resistors (AC-coupled)

1. Turn on both TX and RX
2. TAP[k, 1] = AVCC1 – $I_S R_S$[k,1] and TAP[k, 0] = AVCC1
3. TAP[k, 3:2] = AVCC – $I_{Spec} R_T$[k,1:0]
4. Set D+ = 0; D– = 1
5. Measure currents $I_T$[k, 3:0] at TAP[k, 3:0]
6. Fail if not ($I_T$[k, 3:2] ≈ $I_{Spec}$ & $I_T$[k, 1:0] ≈ $I_S$)
7. TAP[k, 1] = AVCC1 and TAP[k, 0] = AVCC1 – $I_S R_S$[k,1]
8. Set D+ = 1; D– = 0
9. Repeat steps 5 and 6
10. End In some embodiments, the same DC parametric tests may be performed one at a time by disabling the other test using the shared test access as shown in FIG. 9. If the transmitter is to be tested, the receiver may be powered down or the termination resistances are turned off, and vice versa. From a procedural standpoint, DC parametric measurements using the shared test access are identical to those of the DC-coupled HSIO illustrated in FIGS. 6 and 7 except for the test of source termination resistors $R_S$[k, 1:0]. While, for example, the transmitter driver current source is being measured via the TAP[k,1] as shown in FIG. 10, the source resistor $R_S$[k,0] can be measured via the TAP[k,0] or vice versa as it is discussed in FIG. 10.

In some embodiments, bonding wire defects on differential HSIO may be detected utilizing DC parametric measurements. Bonding wire defects on an HSIO that employs differential signaling are often left undetected during a conventional loop-back test. This is because fault tolerance is inherent in the differential signaling, in that distortion caused by defects on one of two differential wires may be tolerated by a signal carried on the remaining fault-free wire.

Figure 11:
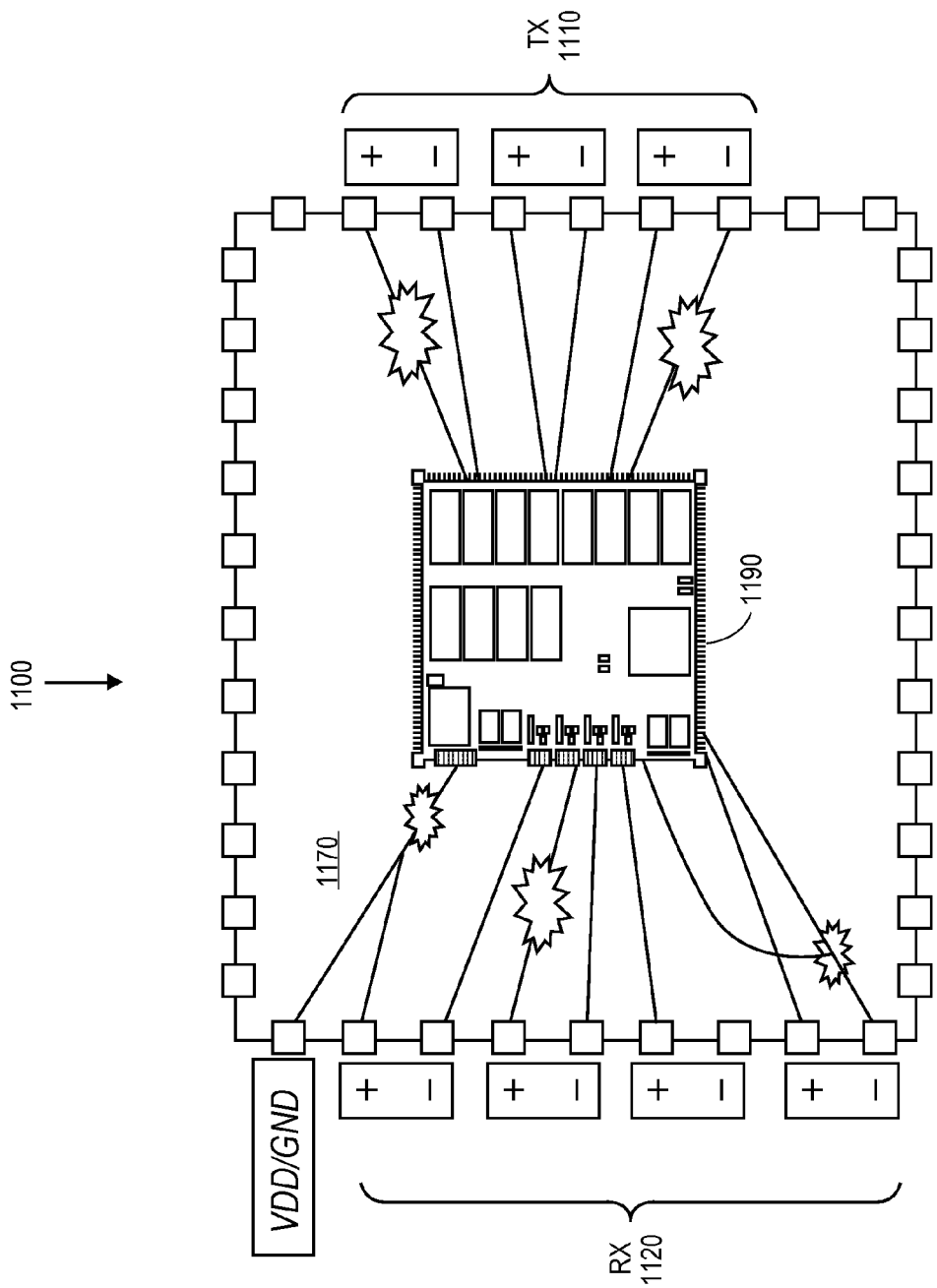
FIG. 11 is an illustration of bonding wire defects for detection using an embodiment of a testing apparatus or system.

FIG. 11 is an illustration of bonding wire defects for detection using an embodiment of a testing apparatus or system. In this illustration, a device 1100 may include a plurality of receiver ports 1120 and a plurality of transmitter ports 1110, which are connected to the integrated circuit 1190 by the bonding wires 1170. The boding wires 1170, for example, may be broken, shorted to power or ground connections, or shorted to each other. These defects may be modeled into the most commonly used fault models, which are open, stuck-at and bridging faults. The open fault behaves like a broken wire, the stuck-at-1 and stuck-at-0 faults like a short to power and to ground respectively, and the bridging fault like a short between differential bonding wires. In some embodiments, the bonding wire test is developed using these fault models.

Figure 12:
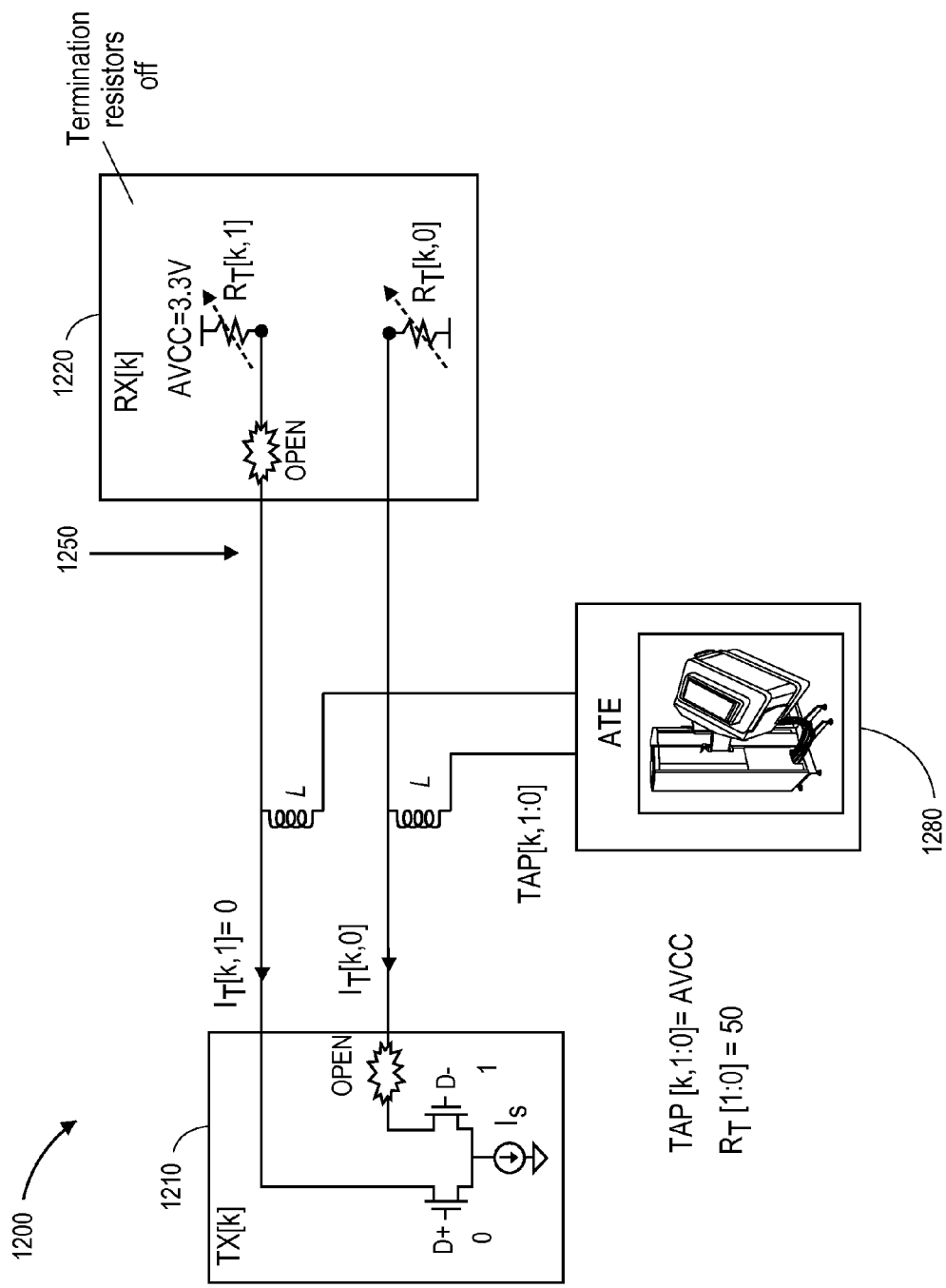
FIG. 12 illustrates an examples of an open fault on the transmitter for detection using an embodiment of a testing apparatus or system.

Faults may occur on the bonding wires of both the transmitter and the receiver. In some embodiments, such faults are detected through use of DC current and voltage measurements. Because bonding wire faults behave in a similar way in both DC-coupled and the AC-coupled HSIO, for simplicity the DC-coupled HSIO is used to illustrate the relevant concepts. FIG. 12 illustrates an example of an open fault on the transmitter for detection using an embodiment of a testing apparatus or system. In this illustration, device 1200 includes transmitter 1210 connected to receiver 1220 via loop-back differential wires 1250, with a test port connection to the differential wires 1250 being generated through use of inductors, such as inductor network 1230, to provide signals for testing by tester 1280. In this illustration, the transmitter and receiver include open faults. In some embodiments, in order to detect an open fault on the transmitter 1210 using the DC current measurement, the receiver may be powered down and no current (or insignificant amount of current) is assumed to be contributed from the receiver. When the receiver is powered down, the open fault presented on the receiver has no effect and a transmitter bonding wire test may be carried out in a similar manner as the transmitter driver current test. The transmitter current source is enabled based on the state of data bit and the current can safely be measured if no open fault is presented. In this manner, the transmitter bonding wire test for open faults may be overlapped with the transmitter driver current test.

Figure 13:
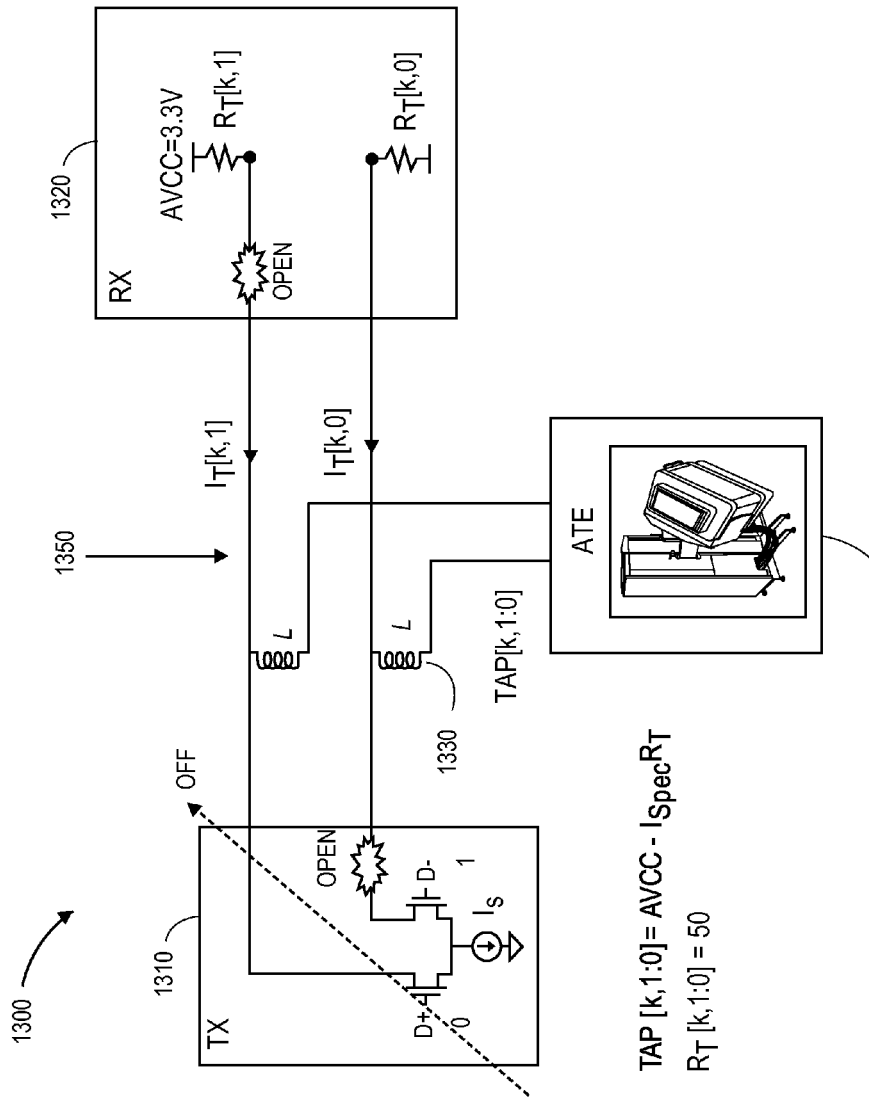
FIG. 13 illustrates an example of an open fault on the receiver for detection using an embodiment of a testing apparatus or system.

FIG. 13 illustrates an example of an open fault on the receiver for detection using an embodiment of a testing apparatus or system. In this illustration, device 1300 includes transmitter 1310 connected to receiver 1320 via loop-back differential wires 1350, with a test port connection to the differential wires 1350 being generated through use of inductors, such as inductor network 1330, to provide signals for testing by tester 1380. In this illustration, the transmitter and receiver include open faults. Similar to the detection of an open fault on the transmitter as illustrated in FIG. 12, in some embodiments the open fault on the receiver may be detected by measuring the DC current from the receiver while the transmitter is being powered down so that no current is flowing into the transmitter. The open fault detection in the receiver may be carried out in a similar manner to a termination resistance test. The voltage of $AVCC-I_{Spec}R_T$ may be applied to the test access ports so that the current $I_T[k, 1:0] \approx I_{Spec}$ is expected, if no open fault is presented. Thus, the receiver open test may be overlapped with the termination resistance test.

In some embodiments, an open test procedure may be summarized as follows in Table 4:

TABLE 4

Open Fault Test using DC Current Measurements

1. Perform TX driver test.
2. Perform termination resistance test.

In some embodiments, the same open faults may be detected by the DC voltage measurements. For the open fault test, both the transmitter and the receiver are turned on. Two DC voltage measurements may be made for the possible value of data bit. The data bit in the transmitter is fixed at a constant of logical '0' or '1' during the voltage measurement.

Figure 14:
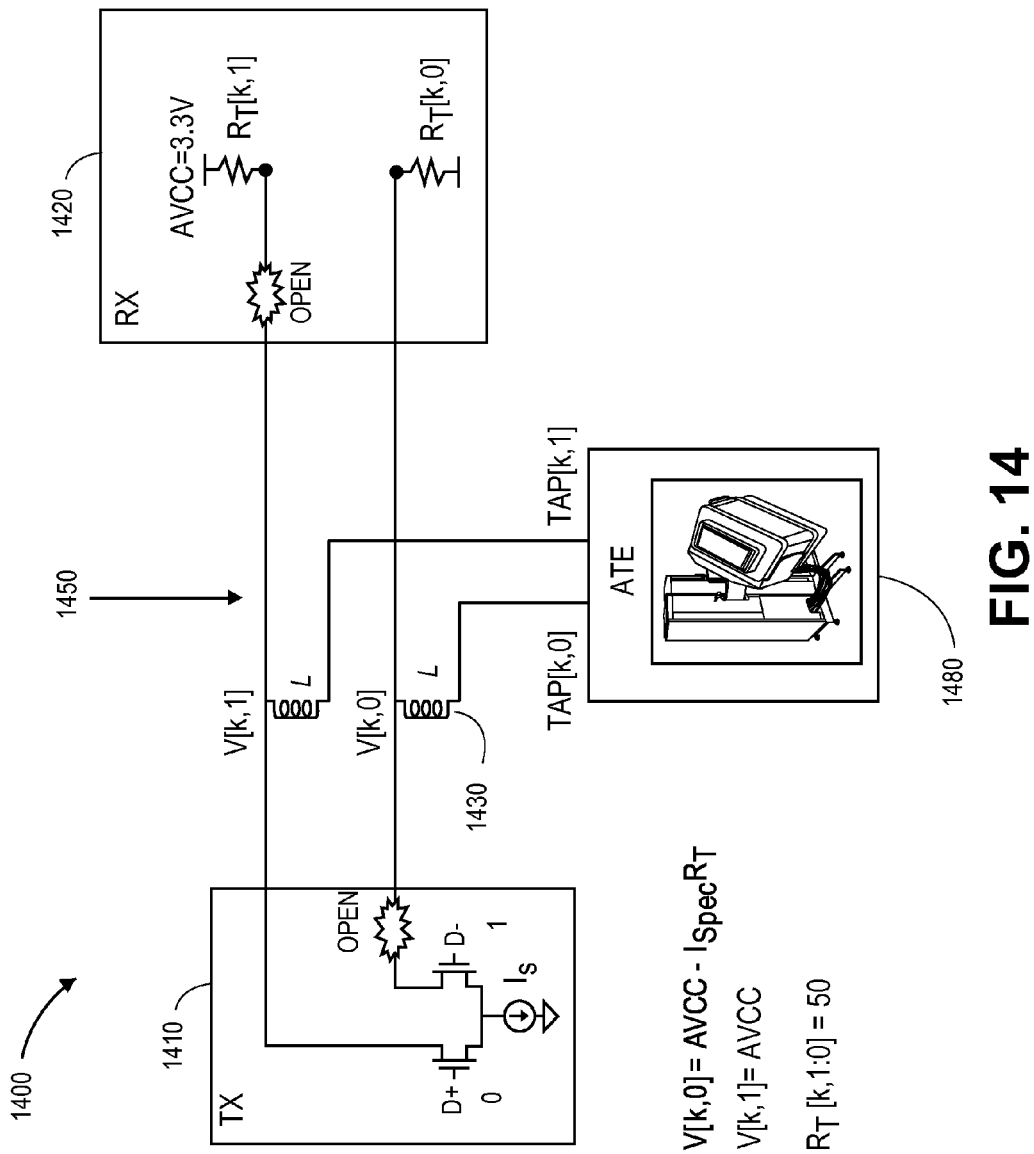
FIG. 14 illustrates an embodiment of open fault detection using DC voltage measurement.

FIG. 14 illustrates an embodiment of open fault detection using DC voltage measurement. In this illustration, device 1400 includes transmitter 1410 connected to receiver 1420 via loop-back differential wires 1450, with a test port connection to the differential wires 1450 being generated through use of inductors, such as inductor network 1430, to provide signals for testing by tester 1480. In this illustration, the transmitter and receiver include open faults. If the data bit D+=0 (and D−=1), the voltages measured at the test access ports are $V[k,0]=AVCC-I_SR_T[k,0]$ and $V[k,1]=AVCC$, if no open fault are present in the path from the transmitter to the receiver. The voltage drop $I_SR_T[k,1]$ is caused by enabling the current source. If the open fault is presented in the transmitter bonding wires, the expected voltage drop cannot be observed and the resulted voltage can be $V[k,0]=AVCC$. Similarly, if the data bit is complemented, i.e. D+=0 (and D−=1), the voltages measured are reversed. If, for example, one of differential bonding wires in the receiver is open, the expected voltage drop is not observed when the transmitter current source is connected. If the open fault is present in the receiver as shown in FIG. 14 and the data bit is set to D+=1 (and D−=0), the voltage source of the transmitter current source is floating. The voltage measured at the floating node may be lower than expected because the current source is trying to drain as much charges as possible reducing the voltage of floating wire. In some embodiments, in order to enhance the test result and to reduce test time, the complementary data may be applied prior to the test data. The complementary data may be utilized to initialize the signal states of floating nodes to the opposite states, which can aid to make the test decision easier.

In some embodiments, an open test based on the voltage measurement may be summarized as follows.

TABLE 5

Open Fault Test using DC Voltage Measurements

1. Turn on both TX and RX
2. Set D+ = 1; D− = 0 // Initialization
3. Set D+ = 0; D− = 1
4. D[1] = D+; D[0] = D−
5. Measure voltages V[k, 1:0] at TAP[k, 1:0] respectively
6. Fail if not $(V[k,1:0] \approx (AVCC - (I_SR_T)*D[j])$
7. Set D+ = 1; D− = 0
8. Repeat steps 4, 5 and 6
9. End Stuck-at faults may cause a bonding wire to behave as a supply power or a ground. In some embodiments, the stuck-at faults may be observed by measuring the currents or voltages when both the transmitter and the receiver are powered down. In an alternative embodiment, the voltages may be measured by properly enabling the transmitter, the receiver, or both the transmitter and the receiver. In some embodiments, because bonding wires may be stuck at the power potential (or logical '1') or ground potential (logical '0'), a stuck-at test may be divided into the stuck-at-1 and stuck-at-0 tests.

Figure 15:
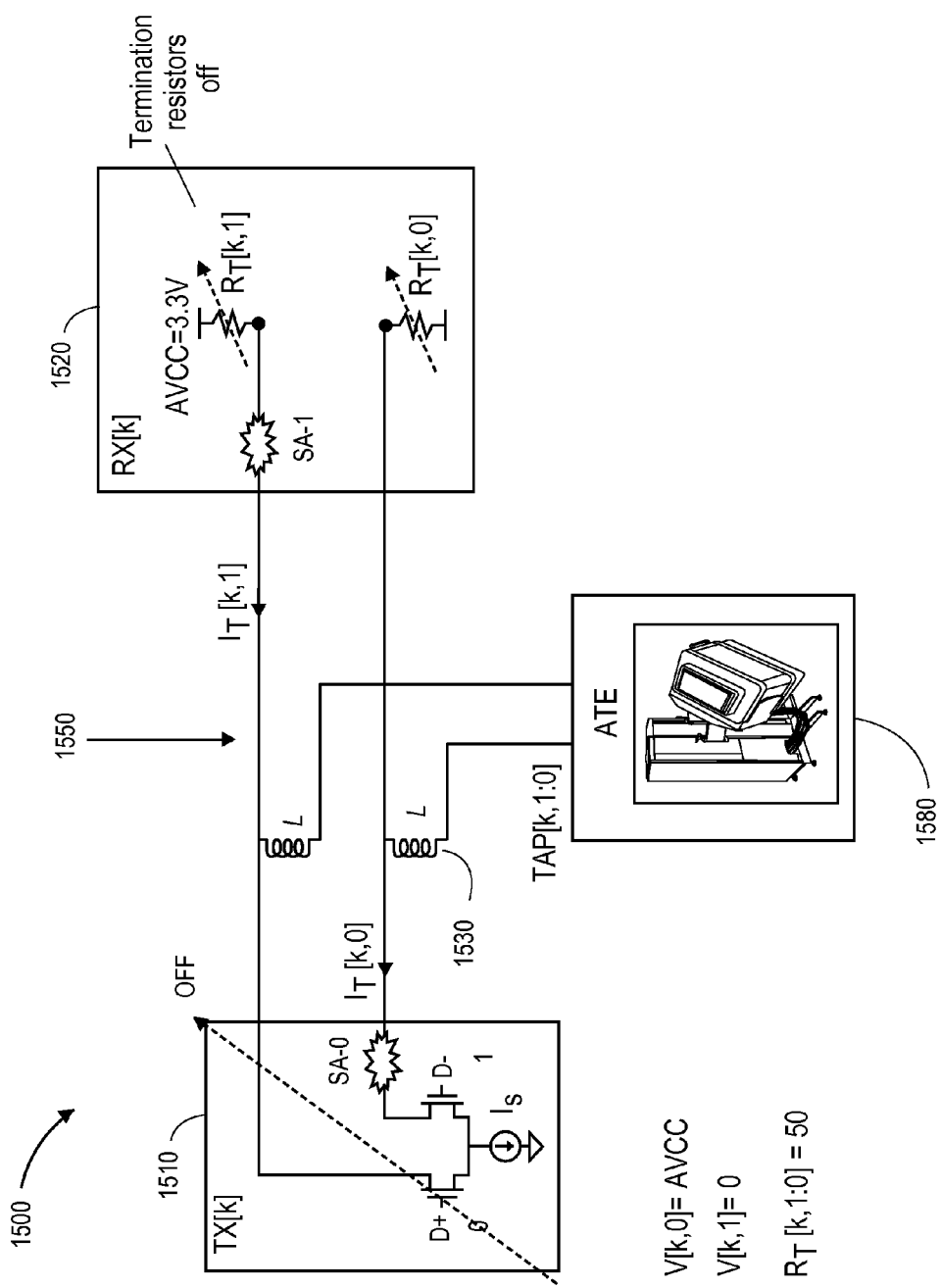
FIG. 15 illustrates an embodiment of detection of stuck-at faults using DC current measurements.

FIG. 15 illustrates an embodiment of detection of stuck-at faults using DC current measurements. In this illustration, device 1500 includes transmitter 1510 connected to receiver 1520 via loop-back differential wires 1550, with a test port connection to the differential wires 1550 being generated through use of inductors, such as inductor network 1530, to provide signals for testing by tester 1580. In this illustration, the transmitter 1510 includes a stuck-at-0 fault and the receiver 1520 includes a stuck-at-1 fault. In some embodiments, in order to detect stuck-at faults using the DC current measurement, both the transmitter 1510 and the receiver 1520 are powered down so that the loop-back connection through the transmitter and the receiver bonding wires is floating. For the stuck-at-0 and the stuck-at-1 faults shown in FIG. 15, the AVCC and the ground (GND) are applied to the fault sites via the test ports respectively causing the current to flow from AVCC to the stuck-at-0 fault site and from the stuck-at-1 fault site to ground.

In some embodiments, a stuck-at test procedure may be summarized as follows.

TABLE 6

Stuck-at Test using DC Current Measurements

1. Turn off both TX and RX
2. TAP[k, 1:0] = AVCC
3. Measure currents $I_T[k, 1:0]$ at TAP[k,1:0] respectively
4. Fail if not $(|I_T[k,1:0]| \approx 0)$
5. Tap[k, 1:0] = GND
6. Repeat steps 3 and 4
7. End In an alternative embodiment, the stuck-at test procedure may be shortened if a half of AVCC can be applied to the TAP[k, 1:0] in step 2, i.e. TAP[k, 1:0]=½AVCC, and values of currents $I_T[k, 1:0]$ are measured without considering its direction. In such a case, steps 5 and 6 may be eliminated. In some embodiments, an alternative stuck-at test procedure may thus be summarized as follows:

TABLE 7

Alternative Stuck-at Test using DC Current Measurements

Figure 16:
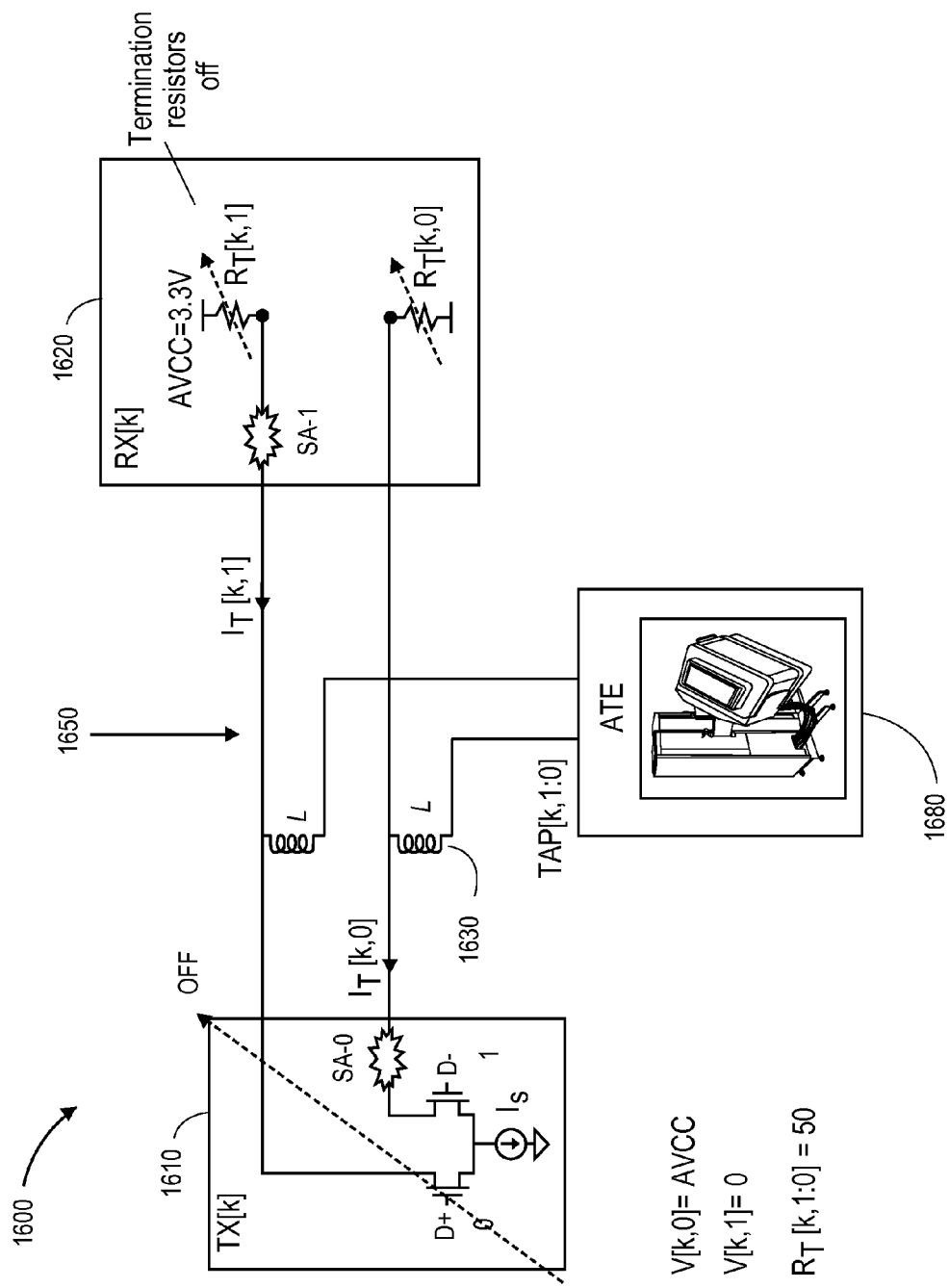
FIG. 16 illustrates an embodiment of detection of stuck-at faults using DC voltage measurements.

1. Turn off both TX and RX
2. TAP[k, 1:0] = ½ AVCC
3. Measure currents $I_T[k, 1:0]$ at TAP[k,1:0] respectively
4. Fail if not $(| I_T[k,1:0] | \approx 0)$, where |x| denotes absolute value of x
5. End FIG. 16 illustrates an embodiment of detection of stuck-at faults using DC voltage measurements. In this illustration, device 1600 includes transmitter 1610 connected to receiver 1620 via loop-back differential wires 1650, with a test port connection to the differential wires 1650 being generated through use of inductors, such as inductor network 1630, to provide signals for testing by tester 1680. In this illustration, the transmitter 1610 includes a stuck-at-0 fault and the receiver 1620 includes a stuck-at-1 fault. In some embodiments, a stuck-at test may be carried out with both the transmitter and the receiver turned off, resulting in the loop-back connections floating. In some embodiments, a test to detect stuck-at faults is based on a concept that the stuck-at faults that model shorts to power (AVCC) and ground (GND) may significantly accelerate a rate of voltage change with respect to time, denoted as dV/dt, at the floating loop-back connection. In such testing, the stuck-at-0 and stuck-at-1 faults may cause the dV/dt≤0 and dV/dt≥0, respectively. In some embodiments, the range of dV/dt for stuck-at fault may imply that the floating loop-back connections be pre-charged to the opposite logical state of the targeted stuck-at fault prior to the test to ensure validity of the test. Thus, if the stuck-at-0 and stuck-at-1 faults are targeted, the floating loop-back connections can be pre-charged to AVCC and GND respectively so that dV/dt can be observed. In such process, voltage may be measured t seconds later and compared to the expected voltage change to make a determination regarding faults. Thus, if the measured voltage is the opposite of what the voltage was pre-charged to, the existence of a stuck-at fault may be concluded.

In some embodiments, the time t may be determined from the time constant RC of the loop-back connection and a test limit for stuck-at-x. Thus, let t(mea−x) be a time at which a voltage measurement may be made for a stuck-at-x fault, where x=0 or 1. Let Δ(sa−x) be a voltage difference between a test limit of stuck-at-x and a floating loop-back connection that is pre-charged as described for a targeted stuck-at-x, where x=0 or 1. The Δ(sa−x) can be expressed as $$\Delta(sa-x) = V_{limit-x}(AVCC - V_{sa-x})$$

where the $V_{sa-x}$ denotes a corresponding voltage level of the stuck-at-x fault and the $V_{limit-x}$ denotes a test limit for the stuck-at-x. Note that if the 0<$V_{limit-x}$<AVCC, the Δ(sa−1)>0 (voltage rise) and the Δ(sa−0)<0 (voltage drop). Let t(sa−x) be a duration of which the voltage change of Δ(sa−x) can occur in a pre-charged floating loop-back connection with a given RC in presence of the stuck-at-x fault. The t(sa−x) is expressed in unit of RC time constant and can be t(sa−x)=M*RC or simply M, M>0. Similarly, let t(no−f) be a duration of which the voltage change of Δ(sa−x) can occur in presence of no fault. The t(no−f)=N*RC or simply N, N>0. Thus, the measurement of voltage may be carried out within the timing window $$t(sa-x) < t(mea-x) << t(no-f)$$

where the symbol << denotes "significantly less than." In general, the t(sa−x) is significantly smaller than the t(no−f). For the stuck-at-1 fault, the t(no−f) may be infinite or extremely large because a floating loop-back connection that is pre-charged to GND cannot be charged to AVCC by itself. Rather, the connection requires an external voltage source that is absent. For the stuck-at-0 fault, the t(sa−0) may still be significantly smaller than the t(no−f) because the stuck-at-0 fault (or a short to GND) can accelerate the voltage drop. The time taken for t(sa−x) can depend on the leakage currents of the transmitter and the receiver when they are turned off. If the leakage currents are assumed to be less than a few microamps, their contribution may thus be viewed as insignificant compared to those of the stuck-at faults. Thus, for example, if t(sa−x)=5 and t(no−f)=100, the voltage can be measured after 50×RC to detect the stuck-at faults.

In some embodiments, the stuck-at test procedure may be summarized as follows in Table 8. In steps 2 and 5, the floating loop-back connections are pre-charged to AVCC and GND for the stuck-at-0 and the stuck-at-1 faults prior to the test, respectively.

TABLE 8

Stuck-at Test using DC Voltage Measurements

1. Turn off both TX and RX
2. TAP[k, 1:0] = AVCC // Pre-charging to AVCC for stuck-at-0 test
3. Measure voltages V[k,1:0] at TAP[k, 1:0]
4. Fail if (V[k,1:0] ≈ GND)
5. TAP[k, 1:0] = GND // Pre-charging to GND for stuck-at-1 test
6. Measure voltages V[k,1:0] at TAP[k, 1:0]
7. Fail if (V[k,1:0] ≈ AVCC)
8. End In some embodiments, if both the transmitter and receiver are turned on, detection of the stuck-at-0 faults may be immediate. This is because the minimum voltage at the loop-back test connection is (AVCC−$I_S R_T$[k,j]), where j=D+) when both the transmitter and the receiver are turned on. In the AC-coupled HSIO, the minimum voltage at (AVCC−$I_S R_S$[k,j]). The minimum voltage is significantly higher than the ground potential, which is the voltage resulting from the stuck-at-0 faults. In some embodiments, this stuck-at-0 detection method may be incorporated into the stuck-at test procedure that employs the voltage measurements discussed above. If desired, the stuck-at-0 faults may be targeted with both the transmitter and the receiver switched on and the stuck-at-1 with both the transmitter and the receiver off.

Bridging faults may create extra signal paths that are not intended in the original design for a device. If, for example, the differential bonding wires are bridged together, there can be a signal path between the shorted bonding wires and the resulting signal path persists in the loop-back connections. In some embodiments, bridging faults may be targeted by sensitizing the extra signal paths formed by the bridging faults using the DC current and voltage. Both the transmitter and the receiver are powered down during such bridging test.

Figure 17:
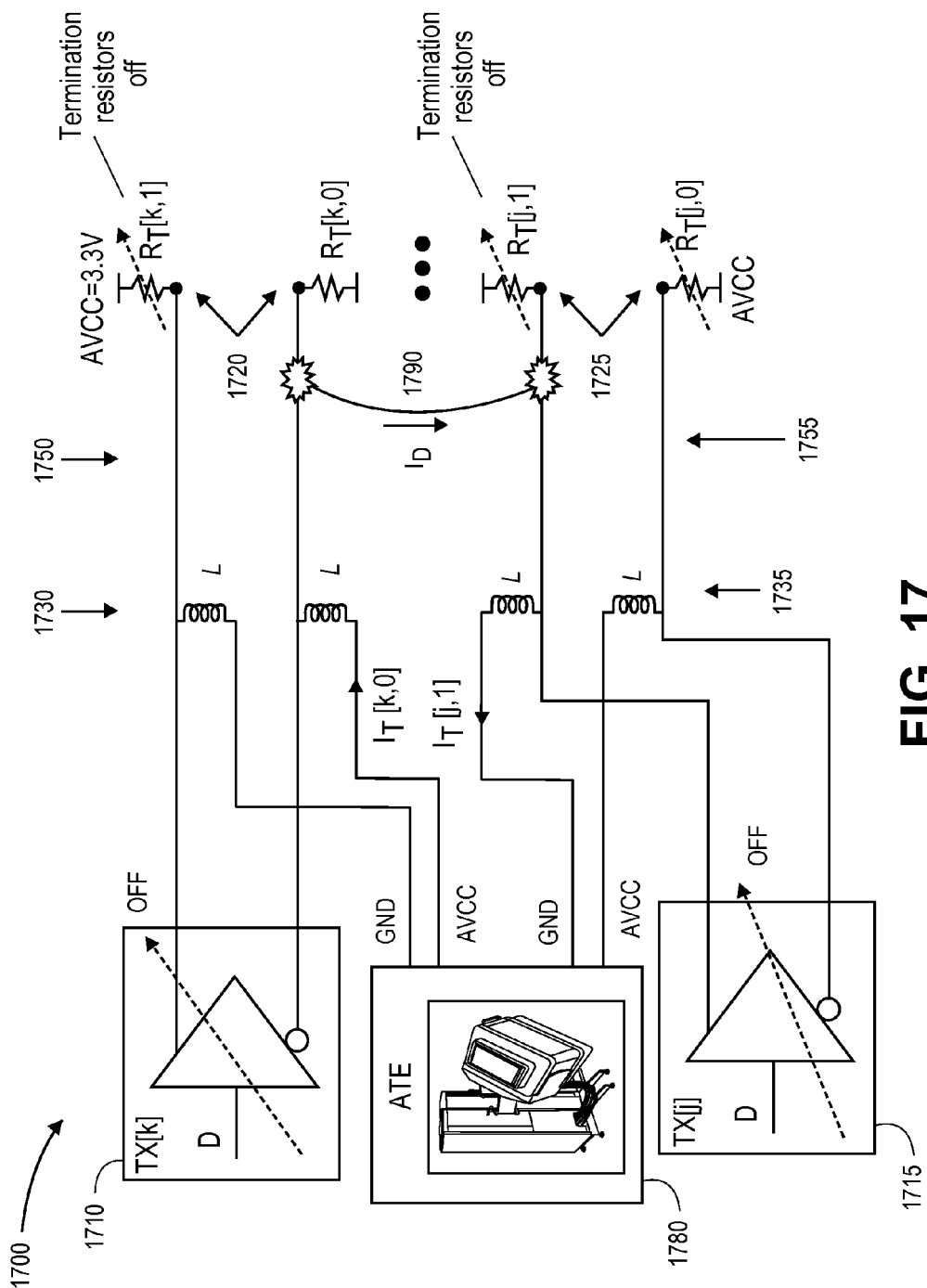
FIG. 17 illustrates an embodiment of detection of bridging faults utilizing measurement of DC current.
Figure 18:
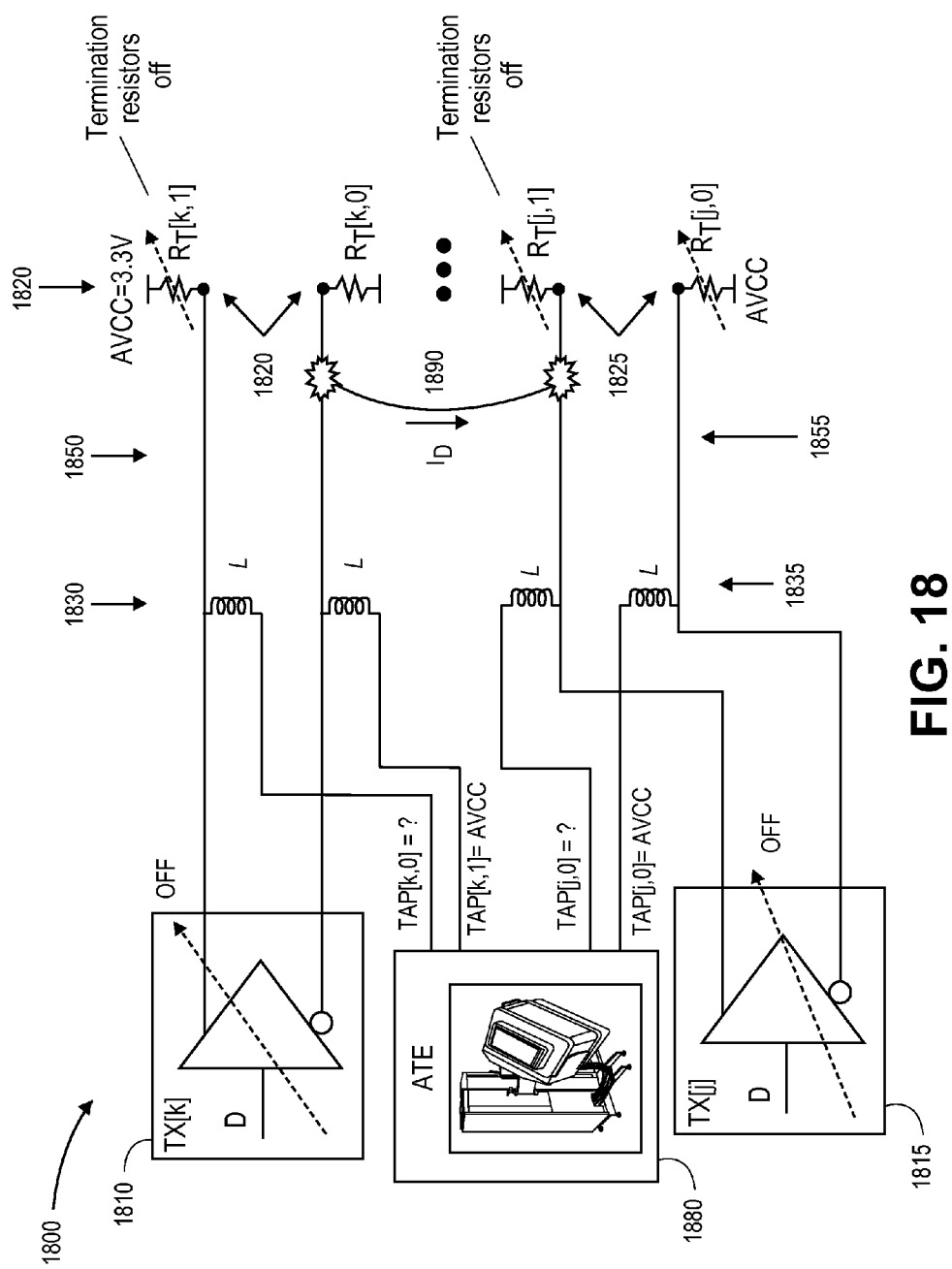
FIG. 18 illustrates an embodiment of detection of bridging faults utilizing measurement of DC voltage.

FIG. 17 illustrates an embodiment of detection of bridging faults utilizing measurement of DC current, and FIG. 18 illustrates an embodiment of detection of bridging faults utilizing measurement of DC voltage. In FIG. 17, a device 1700 includes a first transmitter 1710 coupled via first loopback differential wires 1750 to a first receiver, shown as a first termination resistance 1720, and a second transmitter 1715 coupled via second loopback differential wires 1755 to second receiver, shown as a second termination resistance 1725, Tester 1780 is linked to the first loopback differential wires 1750 via first inductors 1730, and is linked to the second loopback differential wires 1755 via second inductors 1735. In this illustration, a bridging fault 1790 exists between the first loopback differential wires 1750 and the first loopback differential wires 1750. In some embodiments, for the current-based detection as illustrated in FIG. 17, the AVCC voltage potential is forced to one or more test access ports and ground potential is forced to others. In some embodiments, because both the transmitter and the receiver are powered down, in general no current or minimal current will flow if no bridging fault is present. If, however, the current measured at any of test access ports is larger than a certain test limit, then a determination that one or more bridging faults exist may be made.

In FIG. 18, a device 1800 includes a first transmitter 1810 coupled via first loopback differential wires 1850 to a first receiver, shown as a first termination resistance 1820, and a second transmitter 1815 coupled via second loopback differential wires 1855 to second receiver, shown as a second termination resistance 1825. Tester 1880 is linked to the first loopback differential wires 1850 via first inductors 1830, and is linked to the second loopback differential wires 1855 via second inductors 1835. In this illustration, a bridging fault 1890 exists between the first loopback differential wires 1850 and the first loopback differential wires 1850. For the voltage based detection illustrated in FIG. 18, the AVCC potential is forced to one or some of the test access ports, and the resulting voltages are measured at the other test access ports. If any of the voltages measured is larger than the test limit, then a determination that one or more bridging faults are present may be made.

Test costs as measured by the amount of test time required can depend on a number of parallel measurements that are needed to complete an intended test. In order to reduce the test time, the number of parallel measurements should be minimized or reduced. In some embodiments, it is possible to supply a stimulus input to any one test access port at a certain time and to measure the DC currents or voltages at other test access ports to order to make a test decision. In FIG. 17, for example, the AVCC voltage potential may be forced to one TAP at a time and measurements being made of the currents at the remaining test access ports in parallel or at the TAP of which the AVCC is forced. Similarly, in FIG. 18, the AVCC may be forced at one TAP at a time with the voltages at the remaining test access ports being measured in parallel. In some embodiments, such test procedures may take up to N (N=4) parallel measurements to complete the test. In some embodiments, a faster test method may be preferred for certain manufacturing tests.

In some embodiments, the number of parallel current or voltage measurements for a test implementation may be $\lfloor \log_2 N \rfloor$, where N denotes a number of test access ports and where a bottom operator $\lfloor x.y \rfloor$ is defined as $\lfloor x.y \rfloor = x$, if $y=0$ and $\lfloor x.y \rfloor = x+1$, otherwise, where x and y are integers and $x, y \geq 0$. For example, $\lfloor 1.0 \rfloor = 1$ and $\lfloor 1.2 \rfloor = 2$.

In some embodiments, activities that all of the test access ports are engaging in during the DC measurements are defined as a test configuration (TC). Activity of the TAP may be composed of actions such as forcing AVCC, or forcing GND, measuring currents or measuring voltages. Forcing of voltage or current x is denoted as force(x, unit) and measuring a DC signal y is denoted as mea(type(y)). Since a signal type of interest is current and voltage, the units of current (A) and of voltage (V) are used. The activity of TAP in FIG. 17, for example, can be force(AVCC, V)&mea(A) or force(GND, V). In FIG. 18, the activity can be force(AVCC, V) or mea(V).

Figure 19:
FIG. 19 is an illustration of embodiments of test configurations.

FIG. 19 is an illustration of embodiments of test configurations. In some embodiments, the set of test configurations can be obtained by considering a set of all possible combinations of binary values of $\lfloor \log_2 N \rfloor$ variables. A set of all test configurations for eight test access ports, denoted as TC[2:0], is summarized in FIG. 19. In this illustration, the entries of logical 0 and logical 1 in the table shown in FIG. 19 may be interpreted as an activity of the test access port. Interpretation of logical '0' and '1' may be different depending on what is being measured. For example, as in FIG. 16, the logical 1 may be interpreted as a force(AVCC, V)&mea(A) and the logical '0' as a force(GND, V) or vice versa. In FIG. 17, on the other hand, the logical '1' and '0' may be interpreted as force (AVCC, V) and mea(V). Each column of values in the TC[2:0] specifies activity of each TAP for targeted parallel measurements. In some embodiments, the test configurations for a smaller number of test access ports may be generated by restricting the possible combinations. If, for example, there are four test access ports (N=4), then there can be two ($\log_2 4 = 2$) test configurations. The four possible combinations of 2-bit binary values are highlighted and two columns of four bits are assigned to TC[1:0]. Each column of TC[1:0] specifies activities discussed earlier. Thus, if the specified voltages are forced and measured according to the TC[n], where $0 \leq n \leq 1$, and if at least one of the measured currents or voltages exceeds the test limit, presence of the bridging faults can be concluded.

In some embodiments, a bridging test can be summarized as follows in Table 9 and Table 10. The test procedure assumes that the test configurations are computed prior to test and available for the test.

TABLE 9

Bridging Test using DC Current Measurements

1. Turn off both TX and RX
2. For all test configuration (TC[x], $0 \leq x \leq X$), do
   2.1. Force AVCC and GND as specified in TC[x]
   2.2. Measure currents as specified in TC[x]
   2.3. Fail if there exist a current measurement that exceeds test limit
3. End

TABLE 10

Bridging Test using DC Voltage Measurements

1. Turn off both TX and RX
2. For all test configuration (TC[x], $0 \leq x \leq X$), do
   2.1. Force GND to all floating loop-back connections via TAPs
   2.2. Force AVCC as specified in TC[x]
   2.3. Measure voltages as specified in TC[x]
   2.4. Fail if there exist a voltage measurement that exceeds test limit
3. End In some embodiments, a process for locating faults in a device under is provided. Efficiency in fault location is important in the production of devices in order to speed up volume ramp in manufacturing and to expedite the time to market for the devices. The proposed embodiments illustrated in Table 1 through Table 10 may be utilized to aid in determining the location of faults during the fault testing. In some embodiments, a fault is targeted and is located when the expected voltage or current is present or absent.

An open fault may be located when detected as discussed above. In some embodiments, a stuck-at fault is located by identifying the TAP at which the fault induced current or voltage is observed. The phase or direction of fault induced current distinguishes stuck-at-1 and stuck-at-0 faults. The stuck-at-0, for example, behaves as a current sink and stuck-at-1 as a current source.

In some embodiments, a bridging fault is located by the voltage-based method provided in Table 10. In some embodiments, the test configuration in Table 10 is replaced with one-hot test configuration in which only one TAP is forced with the AVCC at a time. The forced voltage is observed via the remaining TAPs. If the voltage is observed at any subset of observing TAPs, a bridging fault among the source TAP and the observing TAPs from which the fault-induced voltage is observed is concluded.

In some embodiments, fault location is performed using the current-based method provided in Table 9. By observing the presence of fault induced current in the one-hot test configuration, the same fault location is determined as is determined in voltage-based testing. In some embodiments, the fault induced current at the TAP with forced AVCC behaves as a current source and the fault induced current at the observing TAPs behaves as current sinks. In some embodiments, a current ratio between source current and sink indicates a number of bonding wires shorted with the sourcing TAP.

Figure 20:
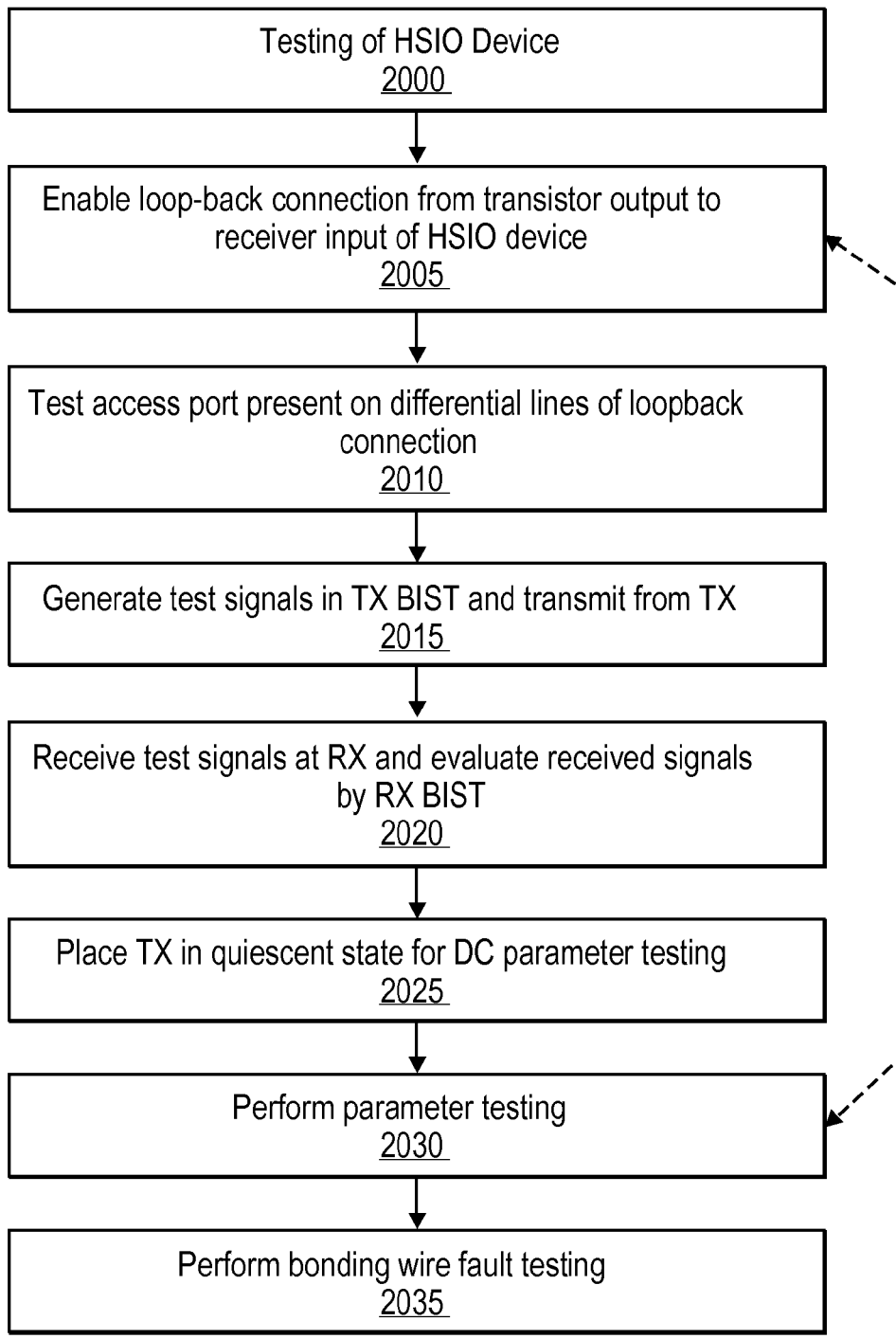
FIG. 20 illustrates an embodiment of a process for testing of high-speed devices.

FIG. 20 illustrates an embodiment of a process for testing of high-speed devices. In this illustration, the testing of a high-speed device 2000 includes enabling loop-back connection from a transmitter output to a receiver input of an HSIO device 2005. In such testing, a test access port is present on the differential lines of the loop-back connection 2010, where the test access port includes inductor connections to block transmission to the test access port during the high-speed operation of the loop-back test. In some embodiments, the loop-back testing might include the generation of transmitter test signal by the transmitter BIST and the transmission of such signals 2015. The test signals are received at the receiver and evaluated by the receiver BIST 2020. In some embodiments, the transmitter may then be placed in a quiescent state for DC parameter testing 2025 and the performance of such parameter testing 2030, as further illustrated in FIG. 21, including measurement of transmitter current and receiver termination resistance. In some embodiments, testing may further include performance of bond wire fault testing 2035, as further illustrated in FIG. 22.

Figure 21:
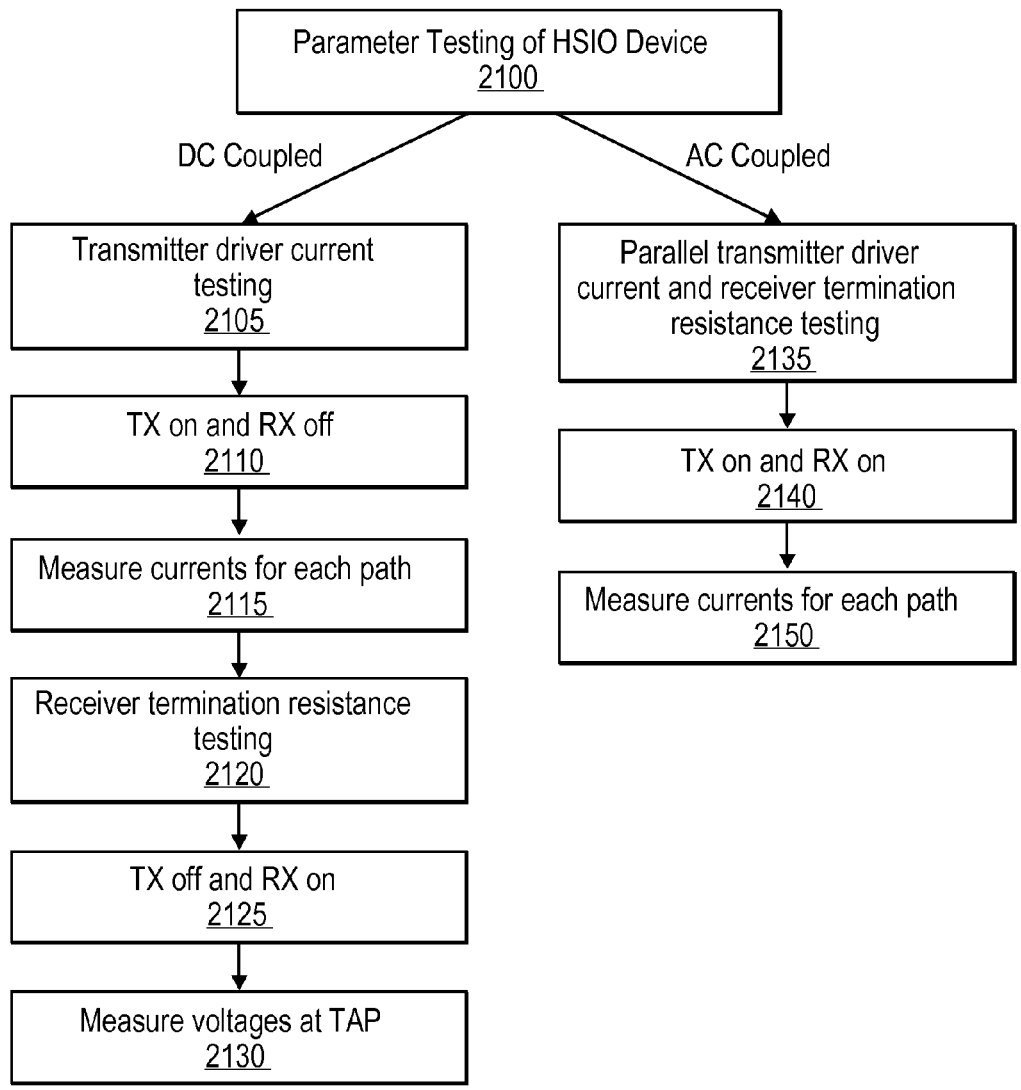
FIG. 21 illustrates an embodiment of a process for parametric testing of high-speed devices.
Figure 22:
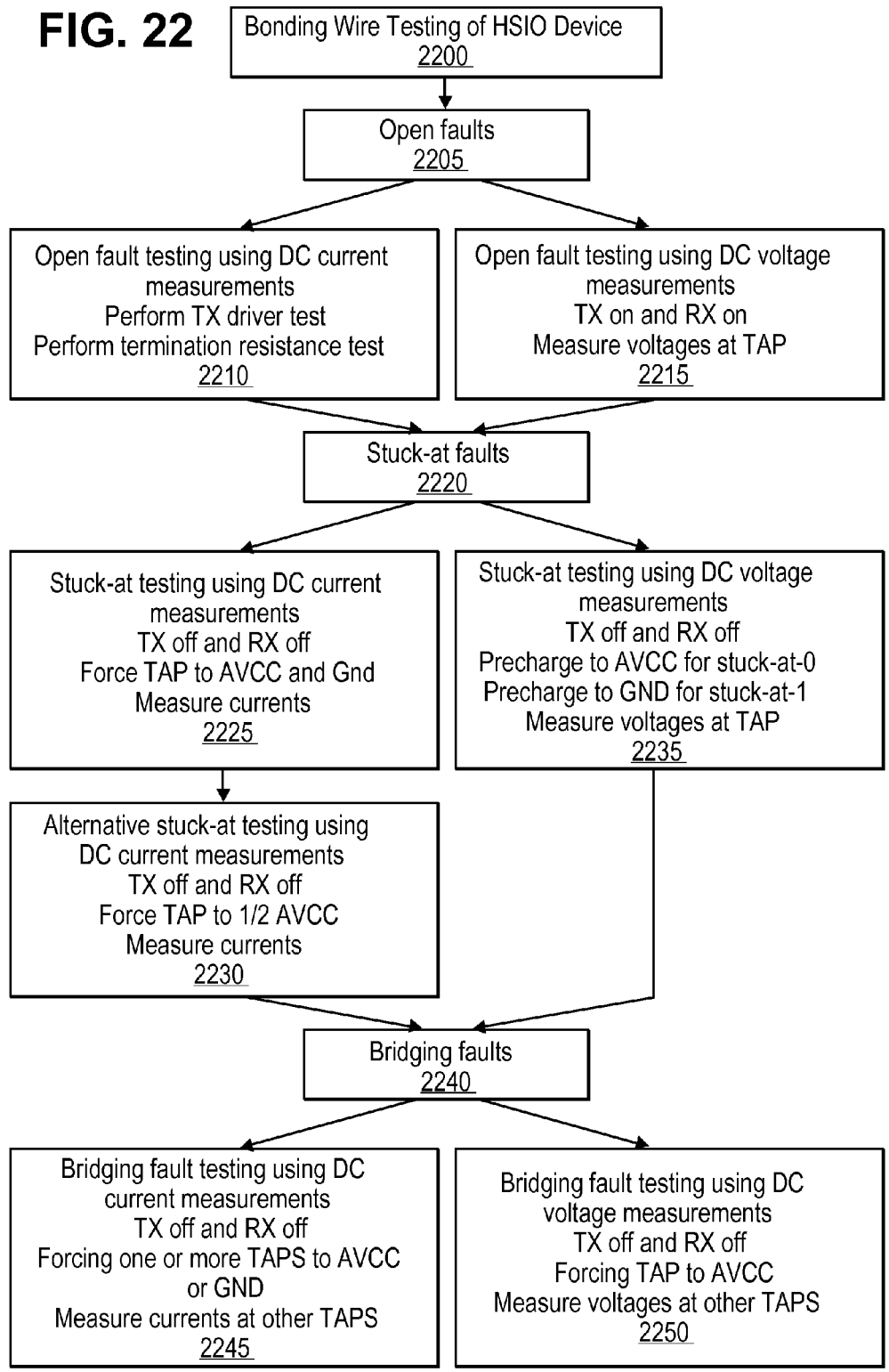
FIG. 22 illustrates an embodiment of a process for bonding wire testing of high-speed devices.

While FIGS. 20, 21, and 22 present a certain order of testing for simplicity in explanation, embodiments are not limited to any particular order of performing the testing. In some embodiments, for example, parametric testing (beginning with element 2030), which may require less test time than loop-back testing (beginning with element 2005), may be performed first, with loop-back testing being performed if the device successfully passes the parametric testing. Further, certain testing may be performed concurrently with other testing.

FIG. 21 illustrates an embodiment of a process for parametric testing of high-speed devices. In some embodiments, for DC coupled circuits parametric testing of an HSIO device 2100 may include transmitter driver current testing 2105, which may include processes described in Table 1. In this illustration, testing may include turning the transmitter on and the receiver off 2110 and measuring current for each path utilizing the test access port 2115. In some embodiments, testing may further include resistor termination testing, which may include processes described in Table 2. In this illustration, testing may include turning the transmitter off and the receiver on 2125 and measuring voltages at the TAP to determine termination resistance 2130. In some embodiments, testing for AC coupled may include parallel transmitter driver current and receiver termination resistance testing, including processes described in Table 3. In this illustration, the testing may include switching the transmitter and the receiver on and measuring currents through each path.

FIG. 22 illustrates an embodiment of a process for bonding wire testing of high-speed devices. In some embodiments, bonding wire testing may include testing for open faults 2205. In some embodiments, open fault testing may include testing using DC measurements, including performance of a transmitter driver test and performance of a termination resistance test 2210. Such testing may include the processes described in Table 4. In some embodiments, open faults may alternatively be detected using DC voltage measurements, including switching transmitter and receiver on measuring voltages at the TAP. Such testing may include the processes described in Table 5.

In some embodiments, bonding wire testing may include testing for stuck-at faults 2220. In some embodiments, stuck-at testing may include testing using DC current measurements, including forcing the TAP to AVCC and to ground and measuring the currents in each case 2225. Such testing may include the processes described in Table 6. In some embodiments, stuck-at testing may include alternative DC current testing, such forcing the TAP to ½ AVCC and measuring the currents at the TAP 2230. Such testing may include the processes described in Table 7. In some embodiments, stuck-at faults may alternatively be detected using DC voltage measurements, including switching the transmitter and the receiver off, forcing the TAP to AVCC and to ground and measuring the voltages at the TAP 2235. Such testing may include the processes described in Table 8.

In some embodiments, bonding wire testing may include testing for bridging faults 2240. In some embodiments, bridging fault testing may include testing using DC current measurements, including switching the transmitter and receiver off, forcing one or more TAPS to AVCC or GND, measuring the currents at each other port 2245. Such testing may include the processes described in Table 9. In some embodiments, bridging faults may alternatively be detected using DC voltage measurements, including switching the transmitter and the receiver off, forcing a TAP to AVCC and measuring the voltages at each other TAP 2250. Such testing may include the processes described in Table 10.

Embodiments are not limited to any particular order of implementing the processes described in Tables 1 through 10, and the processes described in Tables 1 through 10 may be implemented serially or in parallel for all or any subgroup of the transmitter-receiver pairs of a device under test.

Figure 23:
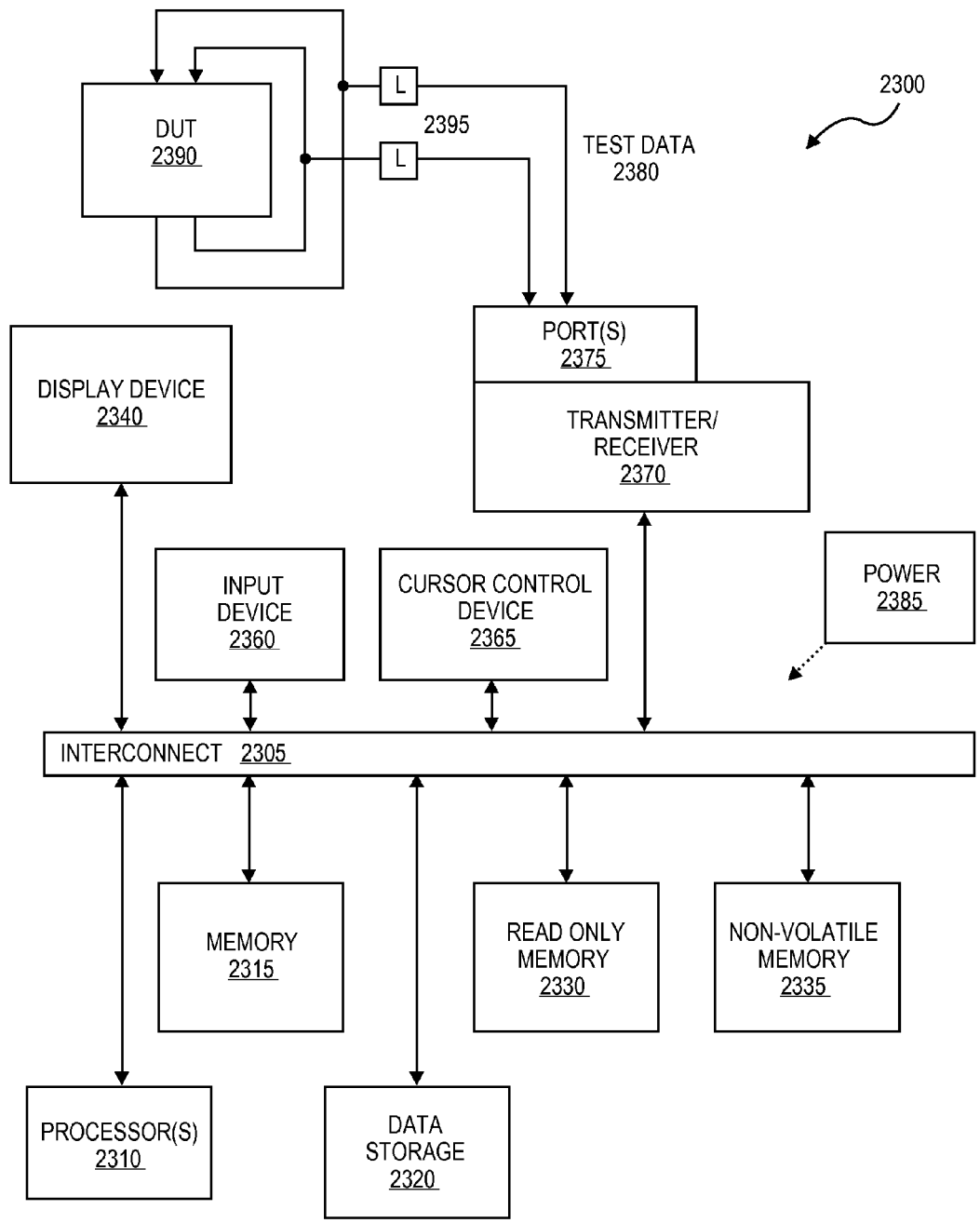
FIG. 23 is an illustration of an embodiment of a device or system for testing high-speed devices.

FIG. 23 is an illustration of an embodiment of a device or system for testing high-speed devices. In this illustration, certain standard and well-known components that are not germane to the present description are not shown. Under some embodiments, a device or system 2300 is a system to evaluate test data including DC current and voltage measurements for purposes of DC parametric testing and bonding wire fault testing of high-speed devices, including HSIO devices.

Under some embodiments, the device or system 2300 comprises an interconnect or crossbar 2305 or other communication means for transmission of data. The data may include audio-visual data and related control data. The device or system 2300 may include a processing means such as one or more processors 2310 coupled with the interconnect 2305 for processing information. The processors 2310 may comprise one or more physical processors and one or more logical processors. Further, each of the processors 2310 may include multiple processor cores. The interconnect 2305 is illustrated as a single interconnect for simplicity, but may represent multiple different interconnects or buses and the component connections to such interconnects may vary. The interconnect 2305 shown in FIG. 23 is an abstraction that represents any one or more separate physical buses, point-to-point connections, or both connected by appropriate bridges, adapters, or controllers. The interconnect 2305 may include, for example, a system bus, a PCI or PCIe bus, a HyperTransport or industry standard architecture (ISA) bus, a small computer system interface (SCSI) bus, a IIC (I2C) bus, or an Institute of Electrical and Electronics Engineers (IEEE) standard 1394 bus, sometimes referred to as "Firewire". ("Standard for a High Performance Serial Bus" 1394-1995, IEEE, published Aug. 30, 1996, and supplements) The device or system 2300 further may include a serial bus, such as USB bus, to which may be attached one or more USB compatible connections.

In some embodiments, the device or system 2300 further comprises a random access memory (RAM) or other dynamic storage device as a memory 2315 for storing information and instructions to be executed by the processors 2310. Memory 2315 also may be used for storing data for data streams or sub-streams. RAM memory includes, for example, dynamic random access memory (DRAM), which requires refreshing of memory contents, and static random access memory (SRAM), which does not require refreshing contents, but at increased cost. DRAM memory may include synchronous dynamic random access memory (SDRAM), which includes a clock signal to control signals, and extended data-out dynamic random access memory (EDO DRAM). In some embodiments, memory of the system may contain certain registers or other special purpose memory. The device or system 2300 also may comprise a read only memory (ROM) 2330 or other static storage device for storing static information and instructions for the processors 2310. The device or system 2300 may include one or more non-volatile memory elements 2335 for the storage of certain elements.

In some embodiments, a data storage 2320 may be coupled to the interconnect 2305 of the device or system 2300 for storing information and instructions. The data storage 2320 may include a magnetic disk, an optical disc and its corresponding drive, or other memory device. Such elements may be combined together or may be separate components, and utilize parts of other elements of the device or system 2300.

The device or system 2300 may also be coupled via the interconnect 2305 to a multi-view display device or element 2340. In some embodiments, the display may include a liquid crystal display (LCD), a plasma display, or any other display technology, for displaying information or content to an end user.

In some embodiments, an input device 2360 may be coupled to or communicate with the apparatus or system 2300 for communicating information and/or command selections to the processors 2310. In various implementations, the input device 2360 may be a remote control, keyboard, a keypad, a touch screen, voice activated system, or other input device, or combinations of such devices. In some embodiments, the device or system 2300 may further include a cursor control device 2365, such as a mouse, a trackball, touch pad, or other device for communicating direction information and command selections to the one or more processors 2310 and for controlling cursor movement on the display 2340.

One or more transmitters or receivers 2370 may also be coupled to the interconnect 2305. In some embodiments, the device or system 2300 may include one or more ports 2375 for the reception or transmission of data. Data that may be received or transmitted may include test data 2380 received from a high-speed device under test 2390, where a test access port (TAP) includes inductors 2395 to block signals during high-speed loop-back testing while passing DC current for DC parameter testing. While the illustration shows a single TAP to a single port, a device under test may include multiple TAPS and the device or system 2300 may include multiple ports for the reception of test data. The device or system 2300 may also comprise a power device or system 2385, which may comprise a power supply, a battery, a solar cell, a fuel cell, or other system or device for providing or generating power. The power provided by the power device or system 2385 may be distributed as required to elements of the device or system 2300.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described. The illustrated elements or components may also be arranged in different arrangements or orders, including the reordering of any fields or the modification of field sizes.

The present invention may include various processes. The processes of the present invention may be performed by hardware components or may be embodied in computer-readable instructions, which may be used to cause a general purpose or special purpose processor or logic circuits programmed with the instructions to perform the processes. Alternatively, the processes may be performed by a combination of hardware and software.

Portions of the present invention may be provided as a computer program product, which may include a non-transitory computer-readable storage medium having stored there on computer program instructions, which may be used to program a computer (or other electronic devices) to perform a process according to the present invention. The computer-readable storage medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other type of media/ computer-readable medium suitable for storing electronic instructions. Moreover, the present invention may also be downloaded as a computer program product, wherein the program may be transferred from a remote computer to a requesting computer.

Many of the methods are described in their most basic form, but processes may be added to or deleted from any of the methods and information may be added or subtracted from any of the described messages without departing from the basic scope of the present invention. It will be apparent to those skilled in the art that many further modifications and adaptations may be made. The particular embodiments are not provided to limit the invention but to illustrate it.

If it is said that an element "A" is coupled to or with element "B," element A may be directly coupled to element B or be indirectly coupled through, for example, element C. When the specification states that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification refers to "a" or "an" element, this does not mean there is only one of the described elements.

An embodiment is an implementation or example of the invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects.

What is claimed is:

1. A high-speed input-output apparatus comprising:
a plurality of transmitters and receivers including a first transmitter and a first receiver;
a plurality of loop-back connections, each loop-back connection being from an output of a transmitter to an input of a respective receiver, each loop-back connection including a first connector and a second connector for transmission of differential signals, the plurality of loop-back connections including a first loop-back connection from the first transmitter to the first receiver; and
a first inductor and a second inductor for each loop-back connection, the first inductor having a first terminal and a second terminal and the second inductor having a first terminal and a second terminal, the first terminal of the first inductor being connected to the first connector of the loop-back connection and the first terminal of the second inductor being connected to the second connector of the loop-back connection, the second terminal of the first inductor and the second terminal of the second inductor providing a test access port for the loop-back connection for direct current testing of the apparatus, the first loop-back connection including a first test access port; and
a receiver built-in self-test (BIST) and a transmitter BIST, wherein the receiver BIST and the transmitter BIST provide for high-speed loop-back testing and direct current testing of the apparatus, wherein the direct current testing includes parameter testing of the apparatus and bonding wire defect testing of the apparatus;
wherein the bonding wire defect testing of the apparatus includes one or more of: testing for stuck-at bonding wire defects, and testing for bridging bonding wire defects;
wherein testing for stuck-at bonding wire defects or bridging bonding wire defects for the first loop-back connection includes:
turning off the connected transmitters and receivers, and measuring a current or voltage at one or more test access ports other than the first test access port.

2. The apparatus of claim 1, wherein the test access port provides signals to a testing apparatus.

3. The apparatus of claim 1, wherein bonding wire defect testing of the apparatus further includes testing for open bonding wire defects.

4. The apparatus of claim 1, further comprising connecting a first isolating resistance connected between the second terminal of the first inductor and ground and a second isolating resistance connected between the second terminal of the second inductor and ground.

5. A method for testing high-speed input-output devices comprising:
enabling a plurality of loop-back connections for a high-speed input-output device including a plurality of transmitters and a plurality of receivers, each loop-back connection being between an output of a transmitter of the device to an input of a respective receiver of the device, each loop-back connection including a first connector and a second connector; and
performing direct current tests on the device, performing the direct current tests including receiving test data via a test access port for each loop-back connection;
wherein for each loop-back connection a first inductor having a first terminal and a second terminal is connected by the first terminal to the first connector of the loop-back connection and a second inductor having a first terminal and a second terminal is connected by the first terminal to the second connector of the loop-back connection, the test access port for each loop-back connection comprising the second terminal of the first inductor for the loop-back connection and the second terminal of the second inductor for the loop-back connection;
wherein the direct-current tests include parameter testing of the device and bonding wire testing of the device, wherein the bonding wire testing of the device includes one or more of: testing for stuck-at bonding wire defects, and testing for bridging bonding wire defects;
wherein testing for stuck-at bonding wire defects or bridging bonding wire defects for first loop-back connection having a first test access port includes:
turning off the connected transmitters and receivers, and measuring a current or voltage at one or more test access ports other than the first test access port.

6. The method of claim 5, wherein the parametric testing of the device include one or more of: measurement of transmitter drive current; and measurement of receiver resistances.

7. The method of claim 5, wherein the bonding wire testing of the device further includes: testing for open bonding wire defects.

8. The method of claim 5, wherein the test access port further includes a first isolating resistance connected between the second terminal of the first inductor and ground and a second isolating resistance connected between the second terminal of the second inductor and ground.

9. The method of claim 5, further comprising performing an active high-speed test of the device using the loop-back connection, the high-speed test including the transmission of differential signals via the first connector and the second connector.

10. The method of claim 9, wherein the test access port remains coupled to the loop-back connection during the performance of the active high-speed test of the device.

11. A method for identifying faults in a device under test comprising:
enabling loop-back connections for the device, wherein the device includes a plurality of transmitters and a plurality of receivers, one or more of the plurality of transmitters being coupled to one or more of the receivers by the loop-back connections, including a first transmitter coupled to a first receiver by a first loop-back connection, wherein each loop-back connection includes a test output port, including a first test access port for the first loop-back connection; and
testing the device under test for bonding wire faults utilizing the test access ports to the loop-back connections;
wherein each loop-back connection includes a first connector and a second connector, and wherein a first inductor for each loop-back connection, the first inductor having a first terminal and a second terminal, is connected by the first terminal to the first connector and a second inductor for each loop-back connection, the first inductor having a first terminal and a second terminal, is connected by the first terminal to the second connector, the test access port for each loop-back connection comprising the second terminal of the first inductor and the second terminal of the second inductor;
wherein locating bonding wire faults includes locating stuck-at faults or bridging faults in the first loop-back connection including:
turning off the connected transmitters and receivers, and measuring a current or voltage at one or more test access ports other than the first test access port.

12. The method of claim 11, wherein locating bonding wire faults includes locating an open fault in the first loop-back connection by:
   locating an open fault in the first transmitter by powering down the first receiver and measuring current or voltage at the first test access port of the first transmitter and receiver; or
   locating an open fault in the first receiver by powering down the first transmitter and measuring current or voltage at the first test access port.

13. The method of claim 12, further comprising repeating detection of open faults for each other loop-back connection.

14. The method of claim 11, wherein locating stuck-at faults further includes:
   forcing the first test access port to a first voltage potential to test for stuck-at-0 fault;
   measuring current or voltage at each other test access port;
   forcing the first access port to a ground potential to test for stuck-at-1 faults;
   measuring current or voltage at each other test access port; and
   locating a stuck-at fault if a current or voltage measurement at any of the other test access ports does not meet one or more thresholds.

15. The method of claim 14, further comprising repeating detection of stuck-at faults for each other loop-back connection.

16. The method of claim 11, wherein locating bridging faults further includes:
   establishing a test configuration in which the first test access port is forced to a certain voltage potential and one or more other test access ports are forced to ground potential;
   measuring voltages or currents at each of the one or more other test access points; and
   locating a bridge defect if a voltage or current measurement for the one or more other test access ports is outside a threshold value.

17. The method of claim 16, further comprising repeating location of bridging faults for each other loop-back connection.

18. A testing system comprising:
   an interface for a device under test, wherein the device under test includes:
      a plurality of transmitters and receivers including a first transmitter and a first receiver;
      a plurality of loop-back connections, each loop-back connection being from an output of each transmitter to an input of a corresponding receiver, each loop-back connection including a first connector and a second connector for transmission of differential signals, the plurality of loop-back connections including a first loop-back connection from the first transmitter to the first receiver;
      a plurality of test access ports, each test access port being coupled to a loop-back connection, each test access port including a first inductor coupled to the first connector of the loop-back connection and a second inductor coupled to the second connector of the loop-back connection, the plurality of test access ports including a first test access port for the first loop-back connection; and
   a test unit, the test unit to be connected to the plurality of test access ports, the test unit being operable to measure voltages or currents at the test access ports and to apply voltages or currents at the test access ports;
   wherein the testing system performs direct current tests on the device under test, performing the direct current tests including receiving test data at the test unit via the test access ports for the loop-back connections;
   wherein the direct current testing includes parameter testing of the device under test and bonding wire testing of the device under test, the bonding wire testing of the device under test includes one or more of: testing for stuck-at bonding wire defects; and testing for bridging bonding wire defects;
   wherein testing for stuck-at faults or bridging faults in the first loop-back connection includes:
      turning off the connected transmitters and receivers, and measuring a current or voltage at one or more test access ports other than the first test access port.

19. The testing system of claim 18, wherein the parametric testing of the device under test include one or more of: measurement of transmitter drive current; and measurement of receiver resistances.

20. The testing system of claim 18, wherein the bonding wire testing of the device under test further includes: testing for open bonding wire defects.

21. The testing system of claim 18, wherein the testing system further performs an active high-speed test of the device under test using the loop-back connections, the high-speed test including the transmission of differential signals via the first connector and the second connector of each loop-back connection.

22. A non-transitory computer-readable storage medium having stored thereon data representing sequences of instructions that, when executed by a processor, cause the processor to perform operations comprising:
   enabling a plurality of loop-back connections for a high-speed input-output device including a plurality of transmitters and a plurality of receivers, each loop-back connection being between an output of a transmitter of the device to an input of a respective receiver of the device, each loop-back connection including a first connector and a second connector; and
   performing direct current tests on the device, performing the direct current tests including receiving test data via a test access port for each loop-back connection;
   wherein for each loop-back connection a first inductor having a first terminal and a second terminal is connected by the first terminal to the first connector of the loop-back connection and a second inductor having a first terminal and a second terminal is connected by the first terminal to the second connector of the loop-back connection, the test access port for each loop-back connection comprising the second terminal of the first inductor for the loop-back connection and the second terminal of the second inductor for the loop-back connection;
   wherein the direct-current tests include parameter testing of the device and bonding wire testing of the device, wherein the bonding wire testing of the device includes one or more of: testing for stuck-at bonding wire defects, and testing for bridging bonding wire defects;
   wherein testing for stuck-at bonding wire defects or bridging bonding wire defects for first loop-back connection having a first test access port includes:
      turning off the connected transmitters and receivers, and measuring a current or voltage at one or more test access ports other than the first test access port.

23. The medium of claim 22, wherein the parametric testing of the device include one or more of: measurement of transmitter drive current; and measurement of receiver resistances.

24. The medium of claim 22, wherein the bonding wire testing of the device further includes: one or more of: testing for open bonding wire defects.

25. The medium of claim 22, further comprising instructions that, when executed by the processor, cause the processor to perform operations comprising:
performing an active high-speed test of the device using the loop-back connection, the high-speed test including the transmission of differential signals via the first connector and the second connector.

26. A non-transitory computer-readable storage medium having stored thereon data representing sequences of instructions that, when executed by a processor, cause the processor to perform operations comprising:
enabling loop-back connections for the device, wherein the device includes a plurality of transmitters and a plurality of receivers, one or more of the plurality of transmitters being coupled to one or more of the receivers by the loop-back connections, including a first transmitter coupled to a first receiver by a first loop-back connection, wherein each loop-back connection includes a test output port, including a first test access port for the first loop-back connection; and
testing the device under test for bonding wire faults utilizing the test access ports to the loop-back connections;
wherein each loop-back connection includes a first connector and a second connector, and wherein a first inductor for each loop-back connection, the first inductor having a first terminal and a second terminal, is connected by the first terminal to the first connector and a second inductor for each loop-back connection, the second inductor having a first terminal and a second terminal, is connected by the first terminal to the second connector, the test access port for each loop-back connection comprising the second terminal of the first inductor and the second terminal of the second inductor;
wherein locating bonding wire faults includes locating stuck-at faults or bridging faults in the first loop-back connection including:
turning off the connected transmitters and receivers, and
measuring a current or voltage at one or more test access ports other than the first test access port.

27. The medium of claim 26, wherein locating bonding wire faults includes locating an open fault in the first loop-back connection by:
locating an open fault in the first transmitter by powering down the first receiver and measuring current or voltage at the test access port of the first transmitter and receiver; and
locating an open fault in the first receiver by powering down the first transmitter and measuring current or voltage at the first test access port.

28. The medium of claim 26, wherein locating stuck-at faults further includes:
forcing the first test access port to a first voltage potential to test for stuck-at-0 fault;
measuring current or voltage at each other test access port;
forcing the first access port to a ground potential to test for stuck-at-1 faults;
measuring current or voltage at each other test access port; and
locating a stuck-at fault if a current or voltage measurement at any of the other test access ports does not meet one or more thresholds.

29. The medium of claim 26, wherein locating bridging faults further includes:
establishing a test configuration in which the first test access port is forced to a certain voltage potential and one or more other test access ports are forced to ground potential;
measuring voltages or currents at each of the one or more other test access points; and
locating a bridge defect if a voltage or current measurement for the one or more other test access ports is outside a threshold value.

* * * * *